(12) United States Patent
Kawaguchi et al.

(10) Patent No.: US 8,981,340 B2
(45) Date of Patent: Mar. 17, 2015

(54) NITRIDE SEMICONDUCTOR DEVICE AND PRODUCTION METHOD THEREOF

(71) Applicant: Panasonic Corporation, Osaka (JP)

(72) Inventors: Yasutoshi Kawaguchi, Toyama (JP);
Toshitaka Shimamoto, Osaka (JP);
Akihiko Ishibashi, Toyama (JP); Isao Kidoguchi, Hyogo (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 46 days.

(21) Appl. No.: 13/856,633

(22) Filed: Apr. 4, 2013

(65) Prior Publication Data

US 2013/0223463 A1 Aug. 29, 2013

Related U.S. Application Data

(63) Continuation of application No. 13/161,543, filed on Jun. 16, 2011, now abandoned, which is a continuation of application No. 10/573,211, filed as application No. PCT/JP2004/014461 on Sep. 24, 2004, now abandoned.

(30) Foreign Application Priority Data

Sep. 25, 2003 (JP) .................. 2003-333217
Mar. 9, 2004 (JP) .................. 2004-065163

(51) Int. Cl.
*H01S 5/32* (2006.01)
*B82Y 20/00* (2011.01)
(Continued)

(52) U.S. Cl.
CPC .............. *H01S 5/3215* (2013.01); *B82Y 20/00* (2013.01); *H01L 33/14* (2013.01); *H01L 33/32* (2013.01);
(Continued)

(58) Field of Classification Search
CPC ........ B82Y 20/00; H01L 33/04; H01L 33/32; H01S 5/34333; H01S 5/3215; H01S 5/2009; H01S 5/22; H01S 5/2214; H01S 5/3054; H01S 5/3063; H01S 5/3072; H01S 5/3077
See application file for complete search history.

(56) References Cited

U.S. PATENT DOCUMENTS 5,646,953 A 7/1997 Naito et al.
5,777,350 A 7/1998 Nakamura et al.
(Continued)

FOREIGN PATENT DOCUMENTS

JP 06-283825 10/1994
JP 08-213692 8/1996
(Continued)

OTHER PUBLICATIONS

International Search Report for corresponding Application No. PCT/JP2004/014461, mailed Jan. 25, 2005.
(Continued)

*Primary Examiner* — Hrayr A Sayadian
(74) *Attorney, Agent, or Firm* — Renner, Otto, Boisselle & Sklar, LLP

(57) ABSTRACT

A nitride semiconductor device according to the present invention includes a p-type nitride semiconductor layer, an n-type nitride semiconductor layer, and an active layer interposed between the p-type nitride semiconductor layer and the n-type nitride semiconductor layer. The p-type nitride semiconductor layer includes: a first p-type nitride semiconductor layer containing Al and Mg; and a second p-type nitride semiconductor layer containing Mg. The first p-type nitride semiconductor layer is located between the active layer and the second p-type nitride semiconductor layer, and the second p-type nitride semiconductor layer has a greater band gap than a band gap of the first p-type nitride semiconductor layer.

8 Claims, 16 Drawing Sheets

(51) Int. Cl.
  H01L 33/32 (2010.01)
  H01S 5/343 (2006.01)
  H01L 33/04 (2010.01)
  H01L 33/14 (2010.01)
  H01S 5/20 (2006.01)
  H01S 5/22 (2006.01)
  H01S 5/30 (2006.01)
  H01L 33/02 (2010.01)

(52) U.S. Cl.
  CPC ............... *H01S 5/2009* (2013.01); *H01S 5/22* (2013.01); *H01S 5/2214* (2013.01); *H01S 5/3054* (2013.01); *H01S 5/3063* (2013.01); *H01S 5/3072* (2013.01); *H01S 5/3077* (2013.01); *H01S 5/3213* (2013.01); *H01S 5/3216* (2013.01); *H01S 5/34333* (2013.01); H01S 2304/04 (2013.01); H01L 33/025 (2013.01); *H01L 33/04* (2013.01)
  USPC ............ 257/13; 257/79; 257/94; 257/96; 257/97; 257/E33.011; 372/45.01; 438/37; 438/45; 438/46; 438/47

(56) References Cited

U.S. PATENT DOCUMENTS

| | | |
|---|---|---|
| 5,959,307 A | 9/1999 | Nakamura et al. |
| 6,121,638 A | 9/2000 | Rennie et al. |
| 6,399,966 B1 | 6/2002 | Tsuda et al. |
| 6,456,640 B1 | 9/2002 | Okumura |
| 6,493,367 B1 | 12/2002 | Ito et al. |
| 6,555,403 B1 | 4/2003 | Domen et al. |
| 6,586,774 B2 | 7/2003 | Ishibashi et al. |
| 6,720,586 B1 | 4/2004 | Kidoguchi et al. |
| 2001/0038656 A1 | 11/2001 | Takeuchi et al. |
| 2002/0041613 A1 | 4/2002 | Yoshida et al. |
| 2002/0045286 A1 | 4/2002 | Koide et al. |
| 2002/0102761 A1 | 8/2002 | Hasegawa et al. |
| 2003/0132448 A1 | 7/2003 | Tsujimura et al. |
| 2003/0136970 A1 | 7/2003 | Takeya et al. |
| 2004/0051105 A1 | 3/2004 | Tsuda et al. |
| 2004/0261692 A1 | 12/2004 | Dwilinski et al. |
| 2005/0236641 A1 | 10/2005 | Goetz et al. |
| 2007/0290230 A1 * | 12/2007 | Kawaguchi et al. .......... 257/196 |
| 2010/0233880 A1 | 9/2010 | Wang et al. |

FOREIGN PATENT DOCUMENTS

| | | |
|---|---|---|
| JP | 10-126006 | 5/1998 |
| JP | 10-126010 | 5/1998 |
| JP | 10-144962 | 5/1998 |
| JP | 11-224972 | 8/1999 |
| JP | 2000-143396 | 5/2000 |
| JP | 2000151023 A | 5/2000 |
| JP | 2000-349398 | 12/2000 |
| JP | 2002-009004 | 1/2002 |
| JP | 2002-124737 | 4/2002 |
| JP | 2002-198314 | 7/2002 |
| JP | 2002-314204 | 10/2002 |
| JP | 2002-324913 | 11/2002 |
| WO | 02/21604 | 3/2002 |
| WO | WO 2005034301 | * 4/2005 |

OTHER PUBLICATIONS

Nakamura, et al., "Violet InGaN/GaN/AlGaN-Based Laser Diodes Operable at 50° C. with a Fundamental Transverse Mode", Jpn. J. Appl. Phys. vol. 38 (1999), pp. L226-L229 (cited in line 15, p. 2 of the description).
Ikeda, et al., "Blue-Violet Laser Diodes Suitable for Blu-ray Disk", Phys. Stat. Sol. (a) 194, No. 2, 407-413 (2002) (cited in line 16 p. 2 of the description).
Asano et al., "100-mW Kink-Free Blue-Violet Laser Diodes With Low Aspect Radio", IEEE Journal of Quantum Electronics, vol. 39, No. 1, Jan. 2003.
Supplementary European Search Report for corresponding Application No. 04773548.5 dated Nov. 9, 2007.
WebQC.org chemical portal (about molar mass of GaN). No Date Available.
About.Com about Chemistry (about Avogadro's Number). No Date Available.
International Preliminary Report on Patentability for corresponding Application No. PCT/JP2004/014461, mailed Jun. 29, 2006.

* cited by examiner

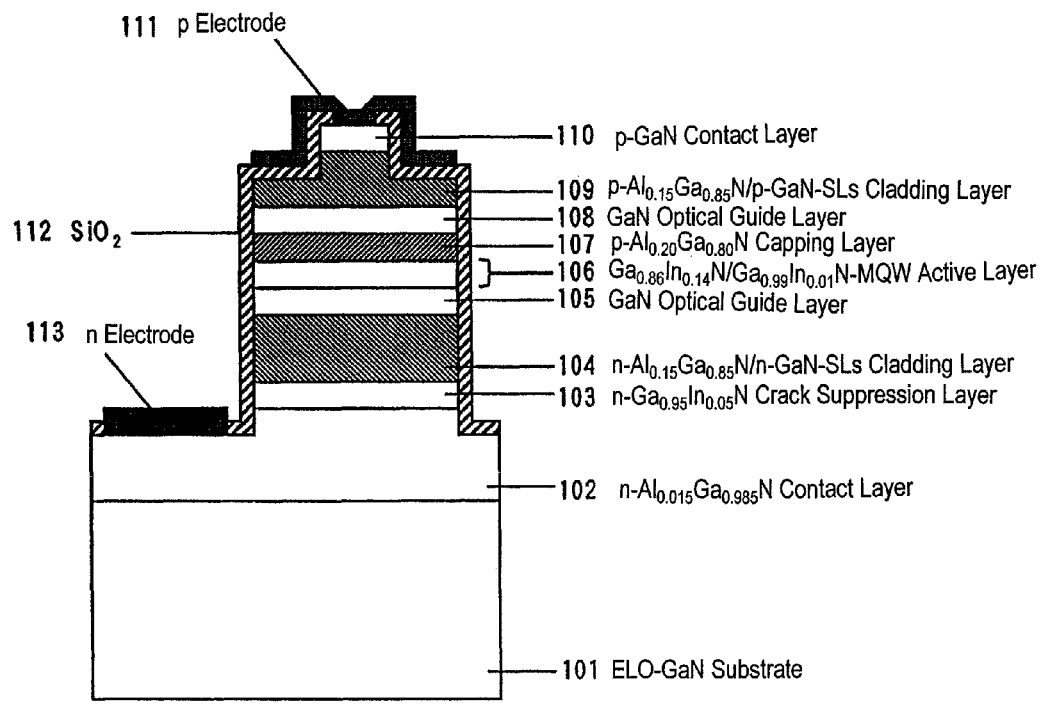

- 111 p Electrode
- 110 p-GaN Contact Layer
- 109 p-Al$_{0.15}$Ga$_{0.85}$N/p-GaN-SLs Cladding Layer
- 108 GaN Optical Guide Layer
- 107 p-Al$_{0.20}$Ga$_{0.80}$N Capping Layer
- 106 Ga$_{0.86}$In$_{0.14}$N/Ga$_{0.99}$In$_{0.01}$N-MQW Active Layer
- 105 GaN Optical Guide Layer
- 104 n-Al$_{0.15}$Ga$_{0.85}$N/n-GaN-SLs Cladding Layer
- 103 n-Ga$_{0.95}$In$_{0.05}$N Crack Suppression Layer
- 102 n-Al$_{0.015}$Ga$_{0.985}$N Contact Layer
- 112 SiO$_2$
- 113 n Electrode
- 101 ELO-GaN Substrate (b)

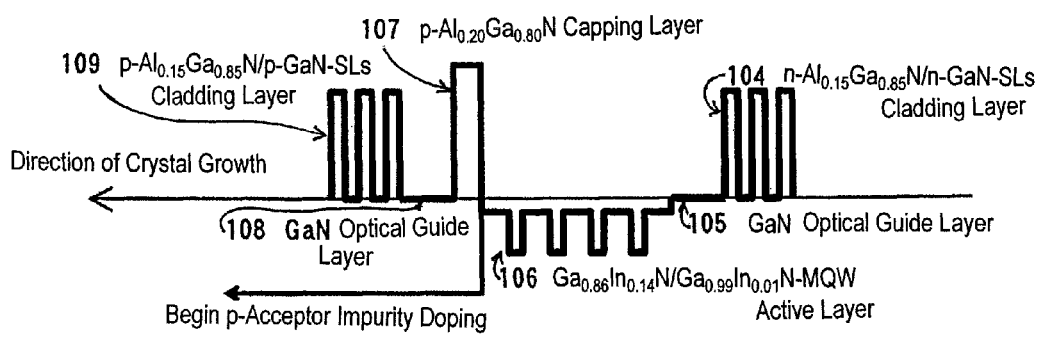

- 109 p-Al$_{0.15}$Ga$_{0.85}$N/p-GaN-SLs Cladding Layer
- 107 p-Al$_{0.20}$Ga$_{0.80}$N Capping Layer
- 104 n-Al$_{0.15}$Ga$_{0.85}$N/n-GaN-SLs Cladding Layer
- 108 GaN Optical Guide Layer
- 106 Ga$_{0.86}$In$_{0.14}$N/Ga$_{0.99}$In$_{0.01}$N-MQW Active Layer
- 105 GaN Optical Guide Layer Direction of Crystal Growth Begin p-Acceptor Impurity Doping

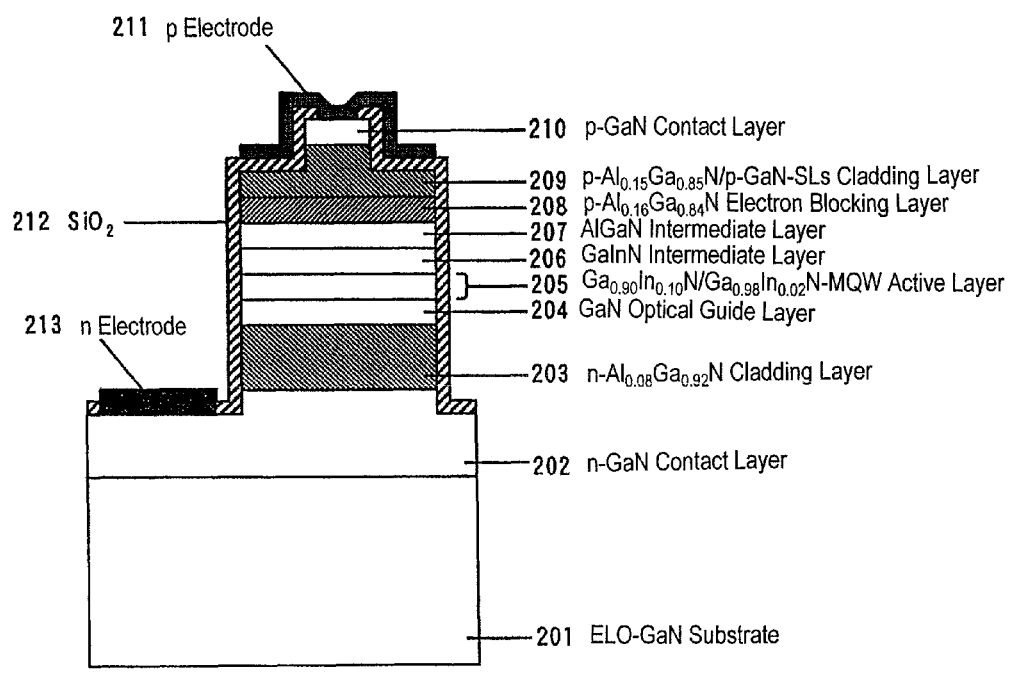

- 211 p Electrode
- 210 p-GaN Contact Layer
- 209 p-$Al_{0.15}Ga_{0.85}$N/p-GaN-SLs Cladding Layer
- 208 p-$Al_{0.16}Ga_{0.84}$N Electron Blocking Layer
- 207 AlGaN Intermediate Layer
- 206 GaInN Intermediate Layer
- 205 $Ga_{0.90}In_{0.10}$N/$Ga_{0.98}In_{0.02}$N-MQW Active Layer
- 204 GaN Optical Guide Layer
- 203 n-$Al_{0.08}Ga_{0.92}$N Cladding Layer
- 212 $SiO_2$
- 213 n Electrode
- 202 n-GaN Contact Layer
- 201 ELO-GaN Substrate (b)

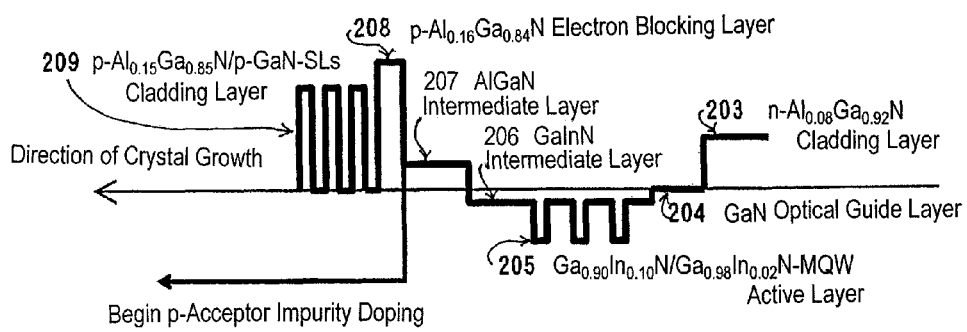

- 209 p-$Al_{0.15}Ga_{0.85}$N/p-GaN-SLs Cladding Layer
- 208 p-$Al_{0.16}Ga_{0.84}$N Electron Blocking Layer
- 207 AlGaN Intermediate Layer
- 206 GaInN Intermediate Layer
- 203 n-$Al_{0.08}Ga_{0.92}$N Cladding Layer
- 204 GaN Optical Guide Layer
- 205 $Ga_{0.90}In_{0.10}$N/$Ga_{0.98}In_{0.02}$N-MQW Active Layer Direction of Crystal Growth Begin p-Acceptor Impurity Doping

NITRIDE SEMICONDUCTOR DEVICE AND PRODUCTION METHOD THEREOF

This application is a continuation of U.S. patent application Ser. No. 13/161,543 filed Jun. 16, 2011, which is a continuation of U.S. patent application Ser. No. 10/573,211 filed Jan. 17, 2007, which claims priority to Japanese Application No. 2003-333217 filed on Sep. 25, 2003, and to Japanese Application No. 2004-065163 filed on Mar. 9, 2004, the entire disclosures of which are incorporated herein by reference.

TECHNICAL FIELD

The present invention relates to nitride semiconductor devices. In particular, the present invention relates to: nitride semiconductor devices including semiconductor light-emitting devices, whose applications to photoelectronic information processing devices and illuminating light sources are considered promising, as well as bipolar-type transistors; and a production method thereof.

BACKGROUND ART

III-V group nitride semiconductors which contain nitrogen (N) as their V group element are regarded as promising materials for short-wavelength light-emitting devices, due to their large band gaps. Among others, vigorous researches are being directed toward gallium nitride-type compound semiconductors (GaN-type semiconductors: AlGaInN), and blue light-emitting diodes (LEDs) and green LEDs have already been put to practical use. Moreover, for the sake of realizing large-capacity optical disk apparatuses, semiconductor lasers having an oscillation wavelength in the 400 nm band are being aspired for. Semiconductor lasers using a GaN-type semiconductor as their material are attracting attention, and are currently coming up to practical levels.

GaN-type semiconductor lasers are disclosed in, for example, Japanese Laid-Open Patent Publication No. 10-126006; Japanese Journal of Applied Physics, Vol. 38, L226-L229 (1999); physica status solidi (a) 194, No. 2, 407-413 (2002); and the like.

Hereinafter, with reference to FIG. 1 and FIG. 2, conventional GaN-type semiconductor lasers will be described.

First, FIG. 1(a) will be referred to.

A semiconductor laser shown in FIG. 1(a) includes a low-dislocation ELO-GaN substrate 101, and a multilayer structure of nitride semiconductors epitaxially grown on the ELO-GaN substrate 101. The ELO-GaN substrate 101 is composed of a thick GaN film which is produced through lateral epitaxial overgrowth.

Beginning from the substrate 101, the semiconductor multilayer structure of FIG. 1(a) includes: an n-$Al_{0.015}Ga_{0.985}N$ contact layer 102; a $Ga_{0.95}In_{0.05}N$ crack suppression layer 103; an n-$Al_{0.15}Ga_{0.85}N$/n-GaN superlattice (SLs) cladding layer 104; a GaN optical guide layer 105; a $Ga_{0.86}In_{0.14}N$/$Ga_{0.99}In_{0.01}N$ multiple quantum well (MQW) active layer 106; a p-$Al_{0.20}Ga_{0.80}N$ capping layer 107; a GaN optical guide layer 108; a p-$Al_{0.15}Ga_{0.85}N$/p-GaN-SLs cladding layer 109; and a p-GaN contact layer 110. Crystal growth of these semiconductor layers is performed by using metal-organic vapor phase epitaxy (MOVPE technique), for example.

The semiconductor multilayer structure constructed as above is processed into a shape as shown in FIG. 1(a), with a p electrode 111, an $SiO_2$ layer 112, and an n electrode 113 being formed thereon.

FIG. 1(b) schematically shows a conduction-band structure of this semiconductor laser. The horizontal axis of FIG. 1(b) corresponds to the distance from the substrate surface; the more toward the left side in the figure, the farther away from the substrate surface. The vertical axis is the energy level at the lower end of the conduction band.

A feature of this semiconductor laser is that, in order to suppress evaporation of In from the active layer during crystal growth and suppress overflowing of electrons from the active layer, the p-$Al_{0.20}Ga_{0.80}N$ capping layer 107 having the largest forbidden band width is formed immediately above the MQW active layer 106.

Next, another GaN semiconductor laser will be described with reference to FIG. 2(a).

Similarly to the semiconductor laser of FIG. 1(a), this semiconductor laser includes an ELO-GaN substrate 201 and a semiconductor multilayer structure formed thereon. The semiconductor multilayer structure includes an n-GaN contact layer 202, an n-$Al_{0.08}Ga_{0.92}N$ cladding layer 203, a GaN optical guide layer 204, a $Ga_{0.90}In_{0.20}N$/$Ga_{0.98}In_{0.02}N$-MQW active layer 205, a GaInN intermediate layer 206, an AlGaN intermediate layer 207, a p-$Al_{0.26}Ga_{0.84}N$ electron blocking layer 208, a p-$Al_{0.15}Ga_{0.85}N$/p-GaN-SLs cladding layer 209, and a p-GaN contact layer 210.

This semiconductor multilayer structure is processed into a shape as shown in FIG. 2(a), with a p electrode 211, an $SiO_2$ layer 212, and an n electrode 213 being formed thereon.

A schematic diagram of a conduction-band structure of this semiconductor laser is shown in FIG. 2(b). A feature of this semiconductor laser is that, in order to minimize light absorption losses associated with the layers doped with p-type impurities, spacer layers called the GaInN intermediate layer 206 and the AlGaN intermediate layer 207 are formed between the MQW active layer 205 and the p-$Al_{0.26}Ga_{0.84}N$ electron blocking layer 208. Moreover, since the GaInN intermediate layer 206 and the AlGaN intermediate layer 207 function also as optical guide layers, no p-type optical guide layers are formed, unlike in the semiconductor laser shown in FIG. 1(a).

Both GaN semiconductor lasers structured as above have been reported to attain continuous oscillation with an output of 30 mW at room temperature.

However, in the semiconductor laser having the structure as shown in FIGS. 1(a) and (b), the active layer 106 having the largest lattice constant in the laser structure is in contact with the AlGaN capping layer 104 having the smallest lattice constant. Therefore, large strain is imposed on the active layer 106, so that the uniformity and reproducibility during the fabrication of the laser device are not very good.

On the other hand, in the semiconductor laser having the structure as shown in FIGS. 2(a) and (b), intermediate layers are inserted between the active layer 205 and the AlGaN electron blocking layer (which serves the same function as that of the AlGaN capping layer 107 of FIG. 1). Therefore, the strain imposed on the active layer is effectively alleviated, thus resulting in an improved uniformity at fabrication of the laser device.

What is common between these semiconductor lasers is that doping of acceptor impurities for realizing p-type crystals is begun when performing the growth of an AlGaN capping layer (AlGaN electron blocking layer) which has the largest band gap in the laser structure.

Usually in nitride-type semiconductors, magnesium (Mg) is often used as an acceptor impurity. It is known that Mg is associated with a phenomenon called "memory effect" at doping during crystal growth. The "memory effect" occurs due to a time lag from the point at which impurity doping is begun during crystal growth until the impurity which has been introduced to the crystal through doping is actually taken in. More specifically, when this memory effect occurs, the doping start position may be shifted from the intended position toward the crystal growth surface, and the concentration increase of the impurity concentration along the depth direction distribution may become draped rather than steep.

Moreover, conversely to the above situation, the "memory effect" may cause a time lag from the point at which doping is finished during crystal growth until the taking-in of the impurity which is introduced to the crystal through doping actually ends. In this case, the doping end position may be shifted from the intended position toward the surface of the crystal growth layer, and the decrease in the Mg concentration of the impurity concentration along the depth direction distribution may become draped rather than steep.

If this memory effect occurs in the case where the start position of Mg doping is set at the start position of the growth of the AlGaN capping layer (AlGaN electron blocking layer) which has the largest band gap in the laser structure, the AlGaN capping layer (AlGaN electron blocking layer) will have portions whose Mg concentration is locally lowered.

In general, the activation energy of an acceptor impurity tends to increase as the band gap energy increases, i.e., as the Al mole fraction in the crystal increases. If portions having low Mg concentrations are created due to Mg doping lags associated with the memory effect, Mg will not be sufficiently activated in such portions, whereby the function of the AlGaN electron blocking layer will be degraded.

In another conventional example described in Japanese Laid-Open Patent Publication No. 2000-143396, Al doping at $2 \times 10^{20}$ cm$^{-3}$ or less is performed when fabricating a p-GaN crystal (this is not to obtain a mixed crystal of AlGaN because it is only performed to a degree where the band gap energy does not change from that of GaN). It describes that the strain in the crystal associated with Mg doping is consequently alleviated, and the Mg as an acceptor impurity is effectively introduced to the positions of Ga atoms in the GaN crystal, thus obtaining a high hole concentration. However, even if Al doping is performed, the Mg concentration in itself has a constant value. Although the activation rate of the acceptor will be improved and a high hole concentration will be realized by controlling the optimum Al concentration, there is no descriptions concerning suppression of the memory effect at the doping interface, or any acceptor impurity profile having a high controllability and steepness.

In still another conventional example which is described in Japanese Laid-Open Patent Publication No. 2002-198314, in order to improve the steepness of the Mg doping profile, a multi-hetero structure (superlattice structure) of AlGaN layers/GaN layers or GaInN layers/GaN layers is fabricated and doped with Mg. According to this method, even if uniform Mg doping is performed, at the hetero interface between a GaN layer and an AlGaN layer or between a GaN layer and a GaInN layer, the Mg concentration has a local increase near the interface of the AlGaN layer or the GaInN layer that is closer to the substrate (closer to where the growth is begun). By utilizing this phenomenon where the Mg concentration is locally increased, interfaces are abundantly formed in order to improve steepness. However, although this method provides an improved steepness, Mg doping lags still occur in the AlGaN layers (which have a large band gap) so that non-uniformity of Mg concentration exists in the AlGaN layers. Moreover, by forming a multitude of hetero interfaces, excesses and insufficiencies of Mg concentration irregularly occur within the crystal, thus resulting in a very low controllability and reproducibility.

In view of the above, the inventors have fabricated a laser structure as shown in FIG. 3(a). The device of FIG. 3(a) has an ELO-GaN substrate 301. The ELO-GaN substrate 301 is an ABLEG (Air-Bridged Lateral Epitaxial Growth) substrate, and has an air gap structure which is not shown. ABLEG is disclosed in detail in Japanese Laid-Open Patent Publication No. 2002-009004, for example.

A semiconductor multilayer structure on the substrate 301 includes an n-GaN contact layer 302, an n-Al$_{0.07}$Ga$_{0.93}$N cladding layer 303, an n-GaN optical guide layer 304, a Ga$_{0.90}$In$_{0.10}$N/Ga$_{0.98}$In$_{0.02}$N-MQW active layer 305, a GaInN intermediate layer 306, a GaN intermediate layer 307, a p-GaN acceptor impurity doping start layer 308, a p-Al$_{0.16}$Ga$_{0.84}$N electron overflow suppression layer 309, a p-Al$_{0.14}$Ga$_{0.86}$N/p-GaN-SLs cladding layer 310, and a p-GaN contact layer 311. FIG. 3(b) schematically shows a conduction-band structure of this laser structure.

A feature of this laser structure is that, instead of beginning an acceptor impurity doping concurrently with beginning the growth of the p-Al$_{0.16}$Ga$_{0.84}$N electron overflow suppression layer 309 having the largest band gap in the laser structure, the p-GaN acceptor impurity doping start layer 308 is provided before that. Although the p-GaN acceptor impurity doping start layer 308 has a doping lag due to the memory effect, a film thickness designing which takes the doping lag into account makes it possible to keep a constant Mg doping concentration in the p-Al$_{0.16}$Ga$_{0.84}$N electron overflow suppression layer 309.

However, in these conventional growing methods, although the Mg concentration has a constant value in the p-Al$_{0.16}$Ga$_{0.84}$N electron overflow suppression layer 309 having the largest band gap energy in the laser structure, time lags due to the memory effect will occur at the start and end of doping, thus resulting in a low steepness of the Mg doping profile. Consequently, the p-Al$_{0.16}$Ga$_{0.84}$N electron overflow suppression layer 309 will be doped only to an Mg concentration which is about 50% to 70% of the Mg concentration in the cladding layer, and, as such, the absolute amount of Mg is not sufficient. Therefore, the efficiency of hole injection to the active layer is lowered, thus making it difficult to realize an adequate low-threshold current driving with a good reproducibility and uniformity. Moreover, since the pn junction is shifted from the position of the active layer, an increase in the threshold voltage will occur.

In order to increase the Mg concentration in the p-Al$_{0.16}$Ga$_{0.84}$N electron overflow suppression layer 309, the p-GaN-acceptor impurity doping start layer 308 may be made thick enough to ensure that the p-Al$_{0.16}$Ga$_{0.84}$N electron overflow suppression layer 309 has an Mg concentration which is about the same as the Mg concentration in the cladding layer. However, since a large amount of Mg will be present also in the p-GaN-acceptor impurity doping start layer 308, this Mg will easily diffuse toward the active layer due to a current applied during laser operation, or a heat or magnetic field that is applied to the laser. As a result, the Mg will reach the neighborhood of the active layer, thus causing light absorption losses near the active layer and unfavorably affecting the reliability of the laser. Thus, it has been difficult to realize a highly reliable laser device with a good reproducibility and uniformity.

The present invention has been made in view of the above circumstances, and is intended to provide a highly reliable nitride semiconductor device with a good production yield.

DISCLOSURE OF INVENTION

A nitride semiconductor device according to the present invention is a nitride semiconductor device comprising a p-type nitride semiconductor layer, an n-type nitride semiconductor layer, and an active layer interposed between the p-type nitride semiconductor layer and the n-type nitride semiconductor layer, wherein, the p-type nitride semiconductor layer includes: a first p-type nitride semiconductor layer containing Al and Mg; and a second p-type nitride semiconductor layer containing Mg, the first p-type nitride semiconductor layer being located between the active layer and the second p-type nitride semiconductor layer, and the second p-type nitride semiconductor layer having a greater band gap than a band gap of the first p-type nitride semiconductor layer.

In a preferred embodiment, the second p-type nitride semiconductor layer functions as a barrier layer for suppressing a carrier overflow from the active layer.

In a preferred embodiment, the first p-type nitride semiconductor layer has an Al concentration of no less than $1 \times 10^{20}$ cm$^{-3}$ and no more than $2 \times 10^{21}$ cm$^{-3}$; and a region of the first p-type nitride semiconductor layer in which the Al concentration is no less than $1 \times 10^{20}$ cm$^{-3}$ and no more than $2 \times 10^{21}$ cm$^{-3}$ has a thickness of 1 nm or more.

In a preferred embodiment, a non-doped nitride semiconductor layer which contains Al and which is located between the first p-type nitride semiconductor layer and the active layer is further comprised.

In a preferred embodiment, the non-doped nitride semiconductor layer has a smaller band gap than a band gap of the second p-type nitride semiconductor layer.

In a preferred embodiment, the non-doped nitride semiconductor layer has a band gap equal to the band gap of the first p-type nitride semiconductor layer.

In a preferred embodiment, a total thickness of the non-doped nitride semiconductor layer and the first p-type nitride semiconductor layer is no less than 1 nm and no more than 50 nm.

In a preferred embodiment, the second p-type nitride semiconductor layer has a thickness of no less than 5 nm and no more than 20 nm.

In a preferred embodiment, a region of the second p-type nitride semiconductor layer which has an Mg concentration of $8 \times 10^{18}$ cm$^{-3}$ or less has a thickness of 1 nm or less.

In a preferred embodiment, the p-type nitride semiconductor layer further includes a third p-type nitride semiconductor layer having a smaller band gap than a band gap of the second p-type nitride semiconductor layer; and the second p-type nitride semiconductor layer is located between the third p-type nitride semiconductor layer and the first p-type nitride semiconductor layer.

In a preferred embodiment, the third p-type nitride semiconductor layer has a smaller band gap than the band gap of the first p-type nitride semiconductor layer.

In a preferred embodiment, the third p-type nitride semiconductor layer functions as a cladding layer.

In a preferred embodiment, at least one of the first p-type nitride semiconductor layer and the second p-type nitride semiconductor layer contains In.

In a preferred embodiment, the second p-type nitride semiconductor layer has a greater In mole fraction than an In mole fraction of the first p-type nitride semiconductor layer.

A production method for a nitride semiconductor device according to the present invention is a production method for a nitride semiconductor device including a p-type nitride semiconductor layer, an n-type nitride semiconductor layer, and an active layer interposed between the p-type nitride semiconductor layer and the n-type nitride semiconductor layer, wherein: the p-type nitride semiconductor layer includes a first p-type nitride semiconductor layer containing Al and Mg and a second p-type nitride semiconductor layer containing Mg; the first p-type nitride semiconductor layer is located between the active layer and the second p-type nitride semiconductor layer; and the second p-type nitride semiconductor layer has a greater band gap than a band gap of the first p-type nitride semiconductor layer, the production method comprising: a step of forming the n-type nitride semiconductor layer; a step of forming the active layer; a step of forming the first p-type nitride semiconductor layer containing Al and Mg by supplying both a source gas having Mg and a source gas having Al; and a step of forming the second p-type nitride semiconductor layer by supplying a source gas having Mg.

In a preferred embodiment, before the step of forming the first p-type nitride semiconductor layer, a step of forming a non-doped nitride semiconductor layer which contains Al by supplying a source gas having Al without supplying any p-type impurities is further comprised.

In a preferred embodiment, the first p-type nitride semiconductor layer has an Al concentration of no less than $1 \times 10^{20}$ cm$^{-3}$ and no more than $2 \times 10^{21}$ cm$^{-3}$; and a region of the first p-type nitride semiconductor layer in which the Al concentration is no less than $1 \times 10^{20}$ cm$^{-3}$ and no more than $2 \times 10^{21}$ cm$^{-3}$ has a thickness of 1 nm or more.

BRIEF DESCRIPTION OF DRAWINGS

FIG. 1(a) is a cross-sectional view showing a conventional example of a GaN semiconductor laser; and FIG. 1(b) is a schematic diagram of a conduction-band structure thereof.

FIG. 2(a) is a cross-sectional view showing another conventional example of a GaN semiconductor laser; and FIG. 2(b) is a schematic diagram of a conduction-band structure thereof.

BEST MODE FOR CARRYING OUT THE INVENTION

Hereinafter, embodiments of the present invention will be described with reference to the figures.

(Embodiment 1)

Firstly, a first embodiment of the nitride semiconductor device according to the present invention will be described.

Figure 4:
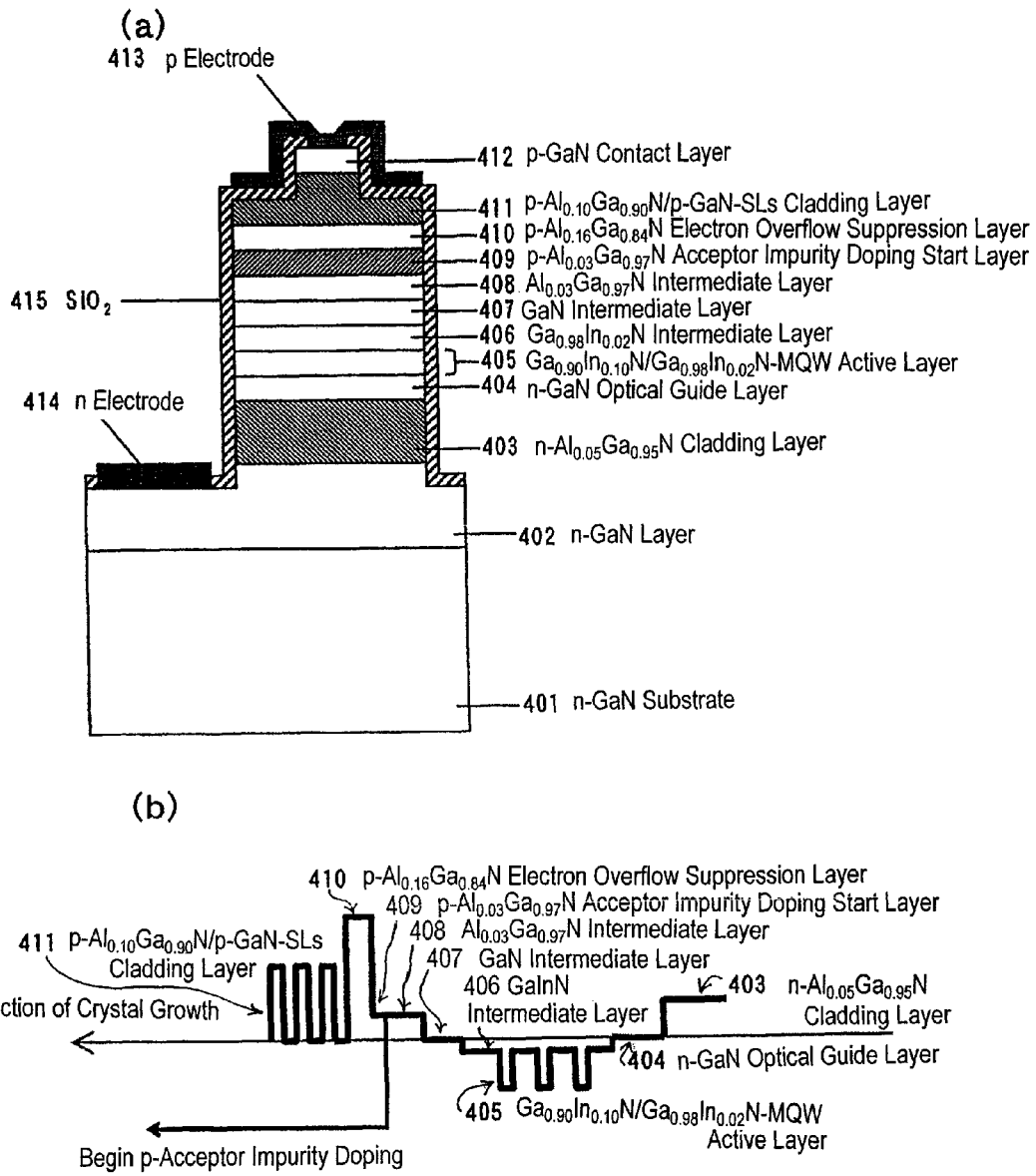
FIG. 4(a) is a cross-sectional structural diagram of a nitride semiconductor laser according to Embodiment 1 of the present invention.
FIG. 4(b) is a schematic diagram of a conduction-band structure thereof.

FIG. 4(a) shows a cross-sectional structure of the semiconductor laser of the present embodiment; and FIG. 4(b) is a schematic diagram of a conduction-band structure thereof. The semiconductor laser of the present embodiment includes an n-GaN substrate 401 and a semiconductor multilayer structure which is formed on the n-GaN substrate 401. Beginning from the substrate, this semiconductor multilayer structure includes: an n-GaN layer 402; an n-$Al_{0.05}Ga_{0.95}N$ cladding layer 403; an n-GaN optical guide layer 404; a $Ga_{0.90}In_{0.10}N/Ga_{0.98}In_{0.02}N$-MQW active layer 405; a non-doped $Ga_{0.98}In_{0.02}N$ intermediate layer 406; a non-doped GaN intermediate layer 407; a non-doped $Al_{0.03}Ga_{0.97}N$ intermediate layer 408; a p-$Al_{0.03}Ga_{0.97}N$ acceptor impurity doping start layer 409; a p-$Al_{0.16}Ga_{0.84}N$ electron overflow suppression layer 410; a p-$Al_{0.10}Ga_{0.90}N$ (2 nm thick)/p-GaN (2 nm thick)-SLs cladding layer (120 pairs) 411; and a p-GaN contact layer 412.

Herein, the p-$Al_{0.03}Ga_{0.97}N$ acceptor impurity doping start layer 409 functions as a "first p-type nitride semiconductor layer containing Al and Mg", whereas the p-$Al_{0.16}Ga_{0.84}N$ electron overflow suppression layer 410 functions as a "second p-type nitride semiconductor layer containing Mg".

As shown in FIG. 4(b), the band gap of the p-$Al_{0.03}Ga_{0.97}N$ acceptor impurity doping start layer 409 is smaller than a band gap of the p-$Al_{0.16}Ga_{0.84}N$ electron overflow suppression layer 410, and smaller than the maximum value among the band gaps of the p-$Al_{0.10}Ga_{0.90}N$ (2 nm thick)/p-GaN (2 nm thick)-SLs cladding layer (120 pairs) 411.

This semiconductor multilayer structure is processed into a shape as shown in FIG. 4(a), with a p electrode 413, an n electrode 414, and an $SiO_2$ layer 415 being formed thereon.

In this semiconductor laser, when a voltage is applied between the n electrode 414 and the p electrode 413, holes will be injected from the p electrode 413 and electrons will be injected from the n electrode 414 into the MQW active layer 405, thus creating a gain in the MQW active layer 405, causing laser oscillation at a wavelength of 410 nm.

Hereinafter, an embodiment of a production method for the semiconductor laser shown in FIG. 4(a) will be described.

In the present embodiment, crystal growth of the nitride semiconductor layer is performed by using an MOVPE technique. The growth pressure may be a reduced pressure, the atmospheric pressure (1atm), or an elevated pressure equal to or greater than the atmospheric pressure, and the growth pressure may be switched to an optimum pressure for each layer. The carrier gas for supplying a source material to the substrate is preferably a gas which at least contains an inert gas such as nitrogen ($N_2$) or hydrogen ($H_2$).

Note that the nitride semiconductor growing method according to the present invention is not limited to the MOVPE technique. All methods which allow a compound semiconductor crystal to be grown are applicable, e.g., hydride vapor phase epitaxy (HYPE technique) or molecular beam epitaxy (MBE technique).

In the present embodiment, firstly, after the surface of the n-GaN substrate 401 is cleaned with an organic solvent, an acid, the n-GaN substrate 401 is placed on a susceptor, and $N_2$ substitution is adequately performed. After the $N_2$ substitution is finished, in the $N_2$ atmosphere, it is heated to 1000° C. with a heating rate of 10° C./10 seconds. Thereafter, the carrier gas is switched to $H_2$, and while concurrently supplying ammonia ($NH_3$), the substrate surface is cleaned for 1 minute.

Next, trimethylgallium (TMG) and monosilane ($SiH_4$) are supplied to grow the n-GaN layer 402 having a thickness of 2 μm. Then, trimethylaluminum (TMA) is added to grow the n-$Al_{0.05}Ga_{0.95}N$ cladding layer 403 having a thickness of 1.5 μm. Thereafter, the TMA supply is stopped, and the n-GaN optical guide layer 404 is grown to a thickness of 0.1 μm.

After growth of the n-GaN optical guide layer 404, the carrier gas is changed to $N_2$, the $NH_3$ supply is stopped, and the growth temperature is lowered to 780° C. Once the growth temperature has become stabilized at 780° C., $NH_3$ is first supplied, and then TMG and trimethylindium (TMI) are supplied. Thus, the $Ga_{0.90}In_{0.10}N/Ga_{0.98}In_{0.02}N$-MQW active layer 405 is grown. The $Ga_{0.90}In_{0.10}N$ well layer has a thickness of 3 nm; the $Ga_{0.98}In_{0.02}N$ barrier layer has a thickness of 7 nm; the number of well layers is three. No intentional doping is performed for the active layer.

Next, after the non-doped $Ga_{0.98}In_{0.02}N$ intermediate layer 406 having a thickness of 30 nm and the non-doped GaN intermediate layer 407 having a thickness of 30 nm are grown, the TMG supply is once stopped. Thereafter, it is quickly heated up to 1000° C. while supplying $N_2$ and $NH_3$, and after the growth temperature has reached 1000° C., the carrier gas is changed to a gaseous mixture of $N_2$ and $H_2$, so that $N_2$, $H_2$ and $NH_3$ are being supplied.

Then, TMG and TMA are immediately supplied, thus growing the non-doped $Al_{0.03}Ga_{0.97}N$ intermediate layer 408 having a thickness of 40 nm. Thereafter, by using bis(cyclopentadienyl)magnesium ($Cp_2Mg$) as an Mg source, the p-$Al_{0.03}Ga_{0.97}N$ acceptor impurity doping start layer 409, which is doped with Mg, is grown to a thickness of 5 nm.

Next, after the p-$Al_{0.16}Ga_{0.84}N$ electron overflow suppression layer 410 having a thickness of 10 nm is grown, the carrier gas is quickly switched to $H_2$ alone, and the p-$Al_{0.10}Ga_{0.90}N$ (2 nm thick)/p-GaN (2 nm thick)-SLs cladding layer (120 pairs) 411 and the p-GaN contact layer 412 having a thickness of 50 nm are stacked in this order.

Next, the p-$Al_{0.03}Ga_{0.97}N$ acceptor impurity doping start layer 409, the p-$Al_{0.16}Ga_{0.84}N$ electron overflow suppression layer 410, the p-$Al_{0.10}Ga_{0.90}N$/p-GaN-SLs cladding layer 411, and the p-GaN contact layer 412 are processed into a stripe shape. Thereafter, both sides of the multilayer structure having been processed into a stripe shape are covered with the $SiO_2$ layer 415 (which is an insulating film), thus forming a current injection region. The stripe width is about 2 to 3 μm.

Next, the p electrode 413 is formed, on the surface of the p-GaN contact layer 412 in an aperture of the SiO$_2$ layer 415 and on a portion of the SiO$_2$ layer 415. Thereafter, the semiconductor multilayer structure is etched to expose a portion of the n-GaN layer 402, and then the n electrode 414 is formed on the exposed surface. Instead of doing this, an n electrode may be formed on the back face of the n-GaN substrate.

In the present embodiment, in order to reduce the contact resistance with the p electrode 413, the Mg concentration in the p-GaN contact layer 411 is adjusted to be within a range from $1 \times 10^{20}$ cm$^{-3}$ to $5 \times 10^{20}$ cm$^{-3}$.

According to the above-described production method, after the non-doped GaN intermediate layer 407 is grown, TMG supply is once stopped while growing the non-doped Al$_{0.03}$Ga$_{0.97}$N intermediate layer 408. Then, a quick heating is performed while supplying N$_2$ and NH$_3$, with the carrier gas being changed to a gaseous mixture of N$_2$ and H$_2$ in the middle.

Alternatively, instead of stopping the TMG supply, the crystal growth of the non-doped GaN intermediate layer 407 may be continued while supplying TMG, and heating may be thus performed. Alternatively, heating may be performed while performing crystal growth of the non-doped Al$_{0.03}$Ga$_{0.97}$N intermediate layer 408 by supplying TMG and TMA. Thus, any heating method may be adopted so long as the method does not produce defects which will cause a nonradiative recombination center within the crystal.

Next, the role of the non-doped Al$_{0.03}$Ga$_{0.97}$N intermediate layer 408 and the p-Al$_{0.03}$Ga$_{0.97}$N-acceptor impurity doping start layer 409 with respect to the Mg concentration distribution in the p-Al$_{0.16}$Ga$_{0.84}$N electron overflow suppression layer 410 will be described.

Figure 5:
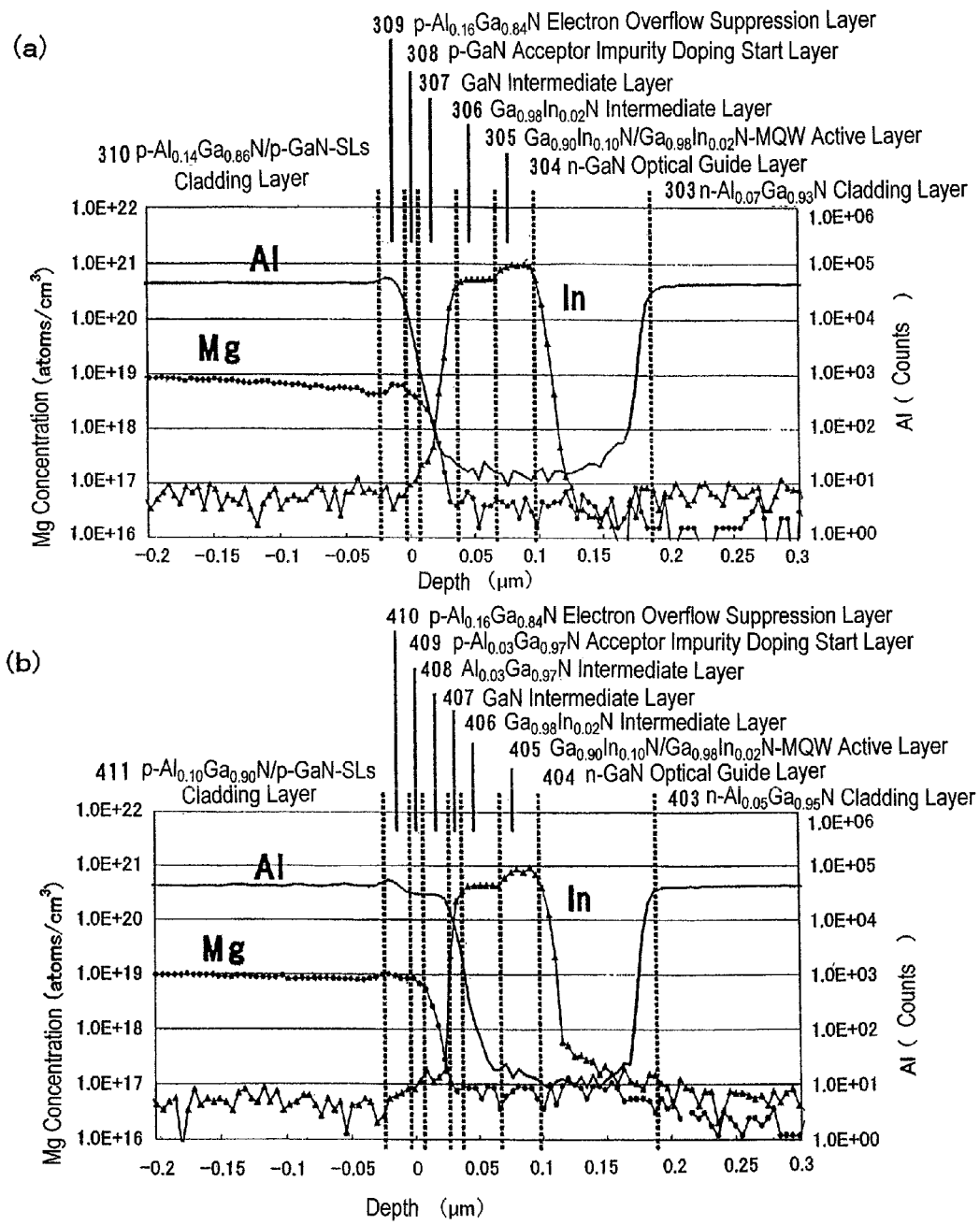
FIG. 5(a) is a graph showing an SIMS profile of the semiconductor laser shown in FIGS. 3(a) and (b)
FIG. 5(b) is a graph showing an SIMS profile of the semiconductor laser of Embodiment 1.

FIG. 5(a) is a graph showing an SIMS profile of the semiconductor laser shown in FIGS. 3(a) and (b). FIG. 5(b) is a graph showing an SIMS profile of the semiconductor laser of the present embodiment, in which the non-doped Al$_{0.03}$Ga$_{0.97}$N intermediate layer 408 and the p-Al$_{0.03}$Ga$_{0.97}$N acceptor impurity doping start layer 409 are formed before growing the p-Al$_{0.16}$Ga$_{0.84}$N electron overflow suppression layer 410. In the graphs, "1.0E+M" means "$1.0 \times 10^{M}$".

In either one of the samples of FIGS. 5(a) and (b), Mg doping is performed in such a manner that the hole concentration in the p-type cladding layer (p-Al$_{0.10}$Ga$_{0.90}$N/p-GaN-SLs cladding layer 411 or the p-Al$_{0.14}$Ga$_{0.86}$N/p-GaN-SLs cladding layer 310) is $2 \times 10^{18}$ cm$^{-3}$. Specifically, Mg doping is performed under conditions such that the Mg concentration in the p-type cladding layer is $1 \times 10^{19}$ cm$^{-3}$.

The film thickness of the p-type acceptor impurity doping start layer 409 is uniformized at 5 nm, and the film thickness of the electron overflow suppression layer 410 is uniformized at 10 nm. In the semiconductor laser of the present embodiment, as is clear from the Mg concentration profile shown in FIG. 5(b), the Mg concentration in the AlGaN electron overflow suppression layer 410 is already at $9.5 \times 10^{18}$ cm$^{-3}$, thus realizing a value which is substantially equal to the target value ($1 \times 10^{19}$ cm$^{-3}$) of the Mg concentration in the cladding layer 411. On the other hand, in the example of FIG. 5(a), there is a clear influence of the doping lag due to the memory effect of Mg doping. Specifically, the Mg concentration is varied along the depth direction in the AlGaN electron overflow suppression layer 309, with its size only being about 5 to $7 \times 10^{18}$ cm$^{-3}$.

Thus, by growing the p-Al$_{0.16}$Ga$_{0.84}$N electron overflow suppression layer 410 after the Al-containing non-doped Al$_{0.03}$Ga$_{0.97}$N intermediate layer 408 and the p-Al$_{0.03}$Ga$_{0.97}$N-acceptor impurity doping start layer 409 are grown, it becomes possible to suppress the doping lag of Mg due to the memory effect. As a result, the Mg concentration in the p-Al$_{0.16}$Ga$_{0.84}$N electron overflow suppression layer 410, which has the largest band gap energy in the laser structure, can be made substantially equal to the Mg concentration in the cladding layer 401.

In order to obtain the effects of the present embodiment, it is preferable that the "Al-containing nitride semiconductor layer (first p-type nitride semiconductor layer)" which is grown after Mg doping is begun and before beginning the growth of the overflow suppression layer 410 (second p-type nitride semiconductor layer) has a thickness of no less than 1 nm and no more than 50 nm. Since it is preferable that the Al-containing nitride semiconductor layer (first p-type nitride semiconductor layer) has a sufficiently high Al concentration, it is preferable that the Al concentration in the first p-type nitride semiconductor layer is no less than $1 \times 10^{20}$ cm$^{-3}$ and no more than $2 \times 10^{21}$ cm$^{-3}$, and that the region in the first p-type nitride semiconductor layer where the Al concentration is no less than $1 \times 10^{20}$ cm$^{-3}$ and no more than $2 \times 10^{21}$ cm$^{-3}$ has a thickness of 1 nm or more.

Moreover, a p-type region may possibly exist in the Al-containing non-doped nitride semiconductor layer (Al$_{0.03}$Ga$_{0.97}$N intermediate layer 408), which is made before growing the first p-type nitride semiconductor layer, because Mg diffuses finally from the first p-type nitride semiconductor layer. However, in the present specification, the Al$_{0.03}$Ga$_{0.97}$N intermediate layer 408 will be referred to as a "non-doped nitride semiconductor layer which contains Al" for simplicity, unless it is intentionally doped with a p-type impurity during growth.

The effects obtained in the present embodiment could also be obtained by employing a p-Al$_{0.90}$In$_{0.10}$N acceptor impurity doping start layer, which contains In instead of Ga. In this case, it is important that a three-layer structure is formed which includes, in conjunction with the p-Al$_{0.16}$Ga$_{0.84}$N electron overflow suppression layer 410 having the largest band gap energy in the laser structure, a non-doped intermediate layer which has a smaller band gap energy (but has a greater band gap energy than that of the Ga$_{0.90}$In$_{0.10}$N/Ga$_{0.98}$In$_{0.02}$N-MQW active layer 405) and which at least contains Al, and an acceptor impurity doping start layer which at least contains Al. The importance of inclusion of Al will be described later.

Note that, in the semiconductor laser described in Japanese Laid-Open Patent Publication No. 2002-009004, a non-doped Al$_X$Ga$_{1-X}$N layer (0≤X≤Y≤1) is inserted between an Mg-doped p-Al$_Y$Ga$_{1-Y}$N layer and an Si-doped n-GaN layer in order to prevent Mg diffusion from the AlGaN layer. With this structure, by the insertion of the non-doped Al$_X$Ga$_{1-X}$N layer, Mg diffusion from the Mg-doped p-Al$_Y$Ga$_{1-Y}$N layer into the active layer (Si-doped n-GaN layer) is suppressed. The purpose of suppressing Mg diffusion is to reduce donor-acceptor pair emission, and ensure that the emission at the band edges is predominant.

In the aforementioned semiconductor laser, diffusion of the Mg impurity can be suppressed because a two-layer structure is formed that employs a non-doped Al$_X$Ga$_{1-X}$N layer in conjunction with the Mg-doped p-Al$_Y$Ga$_{1-Y}$N layer having the largest band gap energy in the laser structure. However, the Mg-doped p-Al$_Y$Ga$_{1-Y}$N layer having the largest band gap energy in the laser structure will suffer from an Mg doping lag due to the memory effect.

Note that, according to the studies of the inventors, it has been found that the Mg diffusion from an Al-containing Mg-doped p-AlGaN layer into an active layer is much less likely to occur than that from an Mg-doped p-GaN layer which does not contain Al. The details of this point will be described later.

In the first place, AlGaN (which contains Al) has a greater band gap energy than that the band gap energy of GaN, and therefore the activation energy of an acceptor impurity for AlGaN is relatively large. Therefore, if Mg doping is begun during growth of AlGaN, the p-type impurity is likely to become inactivated, thus causing deterioration of reproducibility and uniformity, which in itself is undesirable.

Moreover, the lattice constant difference between AlGaN and GaInN is greater than the lattice constant difference between AlGaN and GaN. Therefore, if the AlGaN layer is placed near the active layer, non-uniformity of strain is likely to occur in the well layers composing the active layer. If this strain becomes large, it will unfavorably affect the emission characteristics, which is undesirable for the sake of uniformity and reliability.

However, according to the studies of the inventors, by purposely allowing Al to be contained in GaN, the memory effect of Mg doping can be successfully reduced, and a doping interface with a high steepness can be realized, whereby the emission characteristics of the laser can be significantly improved.

Note that, in order to reduce the lattice strain that may occur in the well layers, it is preferable to prescribe the thickness of the non-doped GaN intermediate layer to a size which is optimum for strain reduction.

Next, the role of Al in the doping start layer will be described.

An Mg source is very likely to adhere to the pipes of a crystal growth apparatus and the inner walls of a reactor. Therefore, in the initial period immediately after the doping is begun, most of the source material is consumed for such reactions. This is the primary cause for the memory effect. Although the influence of the memory effect will also depend on the crystal growth apparatus, if Mg doping is begun during a GaN growth in the crystal growth apparatus which is used in the present embodiment to obtain an Mg concentration of $1 \times 10^{19}$ cm$^{-3}$, the Mg doping front will be shifted toward the crystal surface side by about 10 nm. Therefore, the Mg concentration will reach a 90% level of $1 \times 10^{19}$ cm$^{-3}$ ($9 \times 10^{18}$ cm$^{-3}$) only when the crystal growth has progressed to a thickness of about 200 nm after GaN growth is begun.

On the other hand, when a similar Mg doping was performed during an AlGaN growth to an Al mole fraction of 1%, there was no lag in the Mg doping front, and only 10 nm was required until reaching an Mg concentration of $9 \times 10^{18}$ cm$^{-3}$. This is because, since the reactivity between Mg and Al is very high, if Mg is added to a source gas that contains Al, the Al and Mg immediately react to form a complex, without adhering to the pipes or the inner walls of the reactor, and thus are taken into the crystal.

Figure 6:
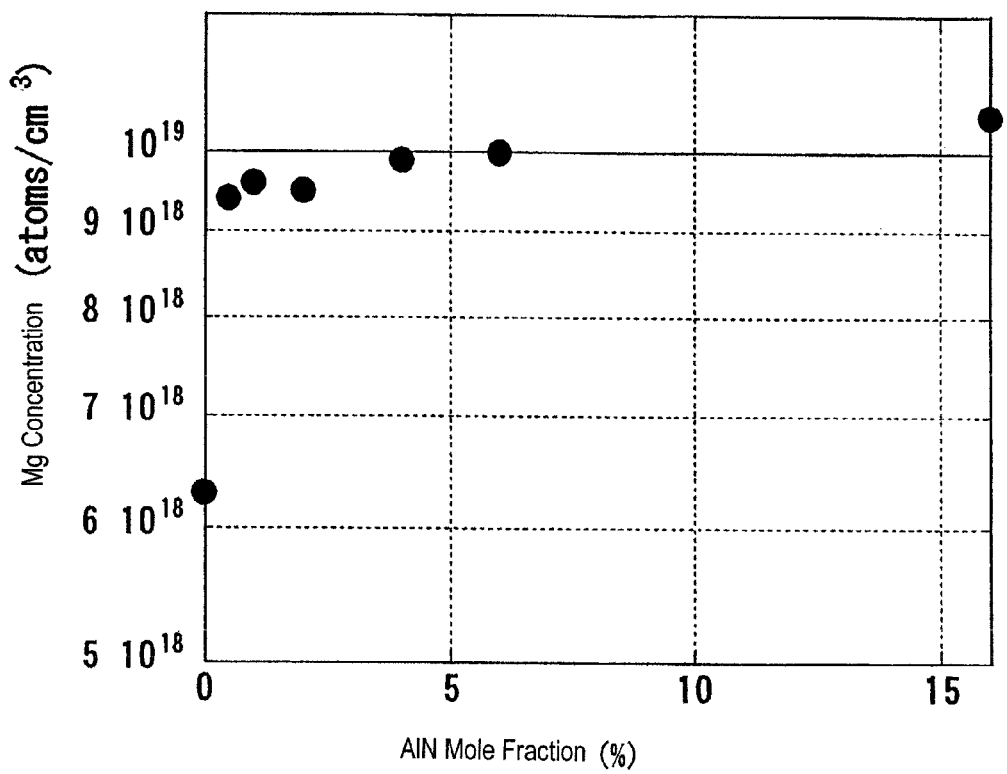
FIG. 6 is a graph showing an Mg concentration in a p-AlGaN current overflow suppression layer, relative to an Al mole fraction of a p-AlGaN-acceptor impurity doping start layer.

Next, FIG. 6 will be referred to. FIG. 6 is a graph showing an Mg concentration in a p-AlGaN current overflow suppression layer, relative to an Al mole fraction of a p-AlGaN-acceptor impurity doping start layer. As shown in FIG. 6, the Al concentration in the p-AlGaN-acceptor impurity doping start layer is preferably set to a value which is equal to or greater than 10 times as much as the Mg doping concentration. Specifically, if the required Mg concentration is $1 \times 10^{19}$ cm$^{-3}$, the Al concentration is preferably set to $1 \times 10^{20}$ cm$^{-3}$, or an Al mole fraction of 0.1% or more in the crystal. It is more preferable to set the Al concentration in the p-AlGaN-acceptor impurity doping start layer to be equal to or greater than 100 times as much as the Mg doping concentration because it would lead to a further increase in the Mg concentration.

Thus, by performing Mg doping while efficiently forming a complex of Al and Mg, the memory effect of Mg can be suppressed. As a result, there is realized an Mg doping profile which has a steep doping interface and is free from doping lags.

Figure 3:
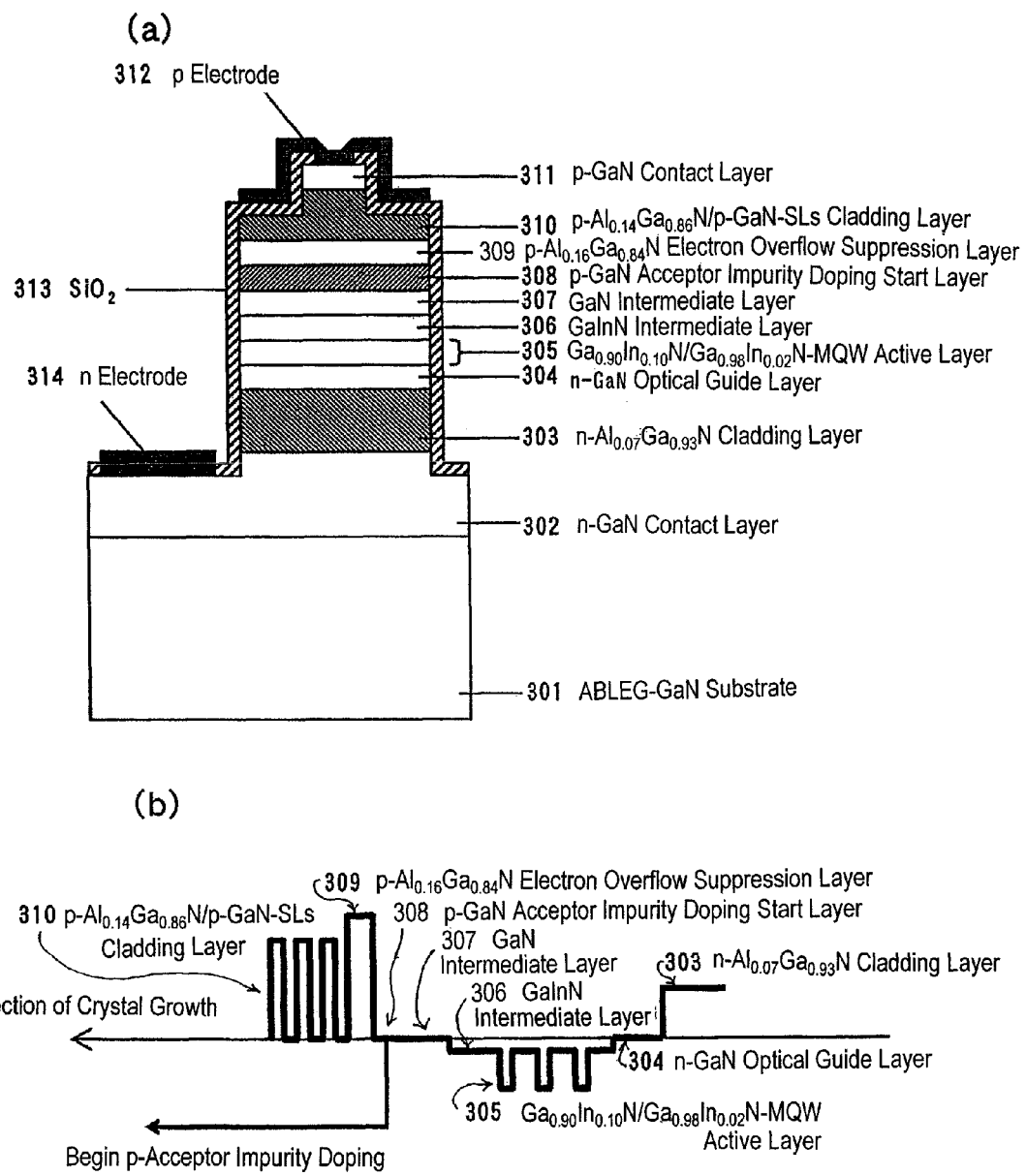
FIG. 3(a) is a cross-sectional view showing still another conventional example of a GaN semiconductor laser.
FIG. 3(b) is a schematic diagram of a conduction-band structure thereof.

Note that, by employing the non-doped Al$_{0.03}$Ga$_{0.97}$N intermediate layer 408 and the p-Al$_{0.03}$Ga$_{0.97}$N acceptor impurity doping start layer 409 instead of the GaN intermediate layer 307 and the p-GaN acceptor impurity doping start layer 308 in the semiconductor laser shown in FIG. 3, the compressive stress when forming the electron overflow suppression layer can be reduced.

A compressive stress creates a piezoelectric field, and the resulting changes in the band structure cause the acceptor impurity to be diffused, thus creating a non-uniform concentration distribution. However, since the present embodiment employs a combination of an Al-containing intermediate layer and an acceptor impurity doping start layer which can reduce compressive stress, an Mg doping profile with an excellent steepness can be effectively realized.

The acceptor level which is constituted by the Mg within a GaN crystal has a greater activation energy than that of Si, which is a donor impurity. Therefore, optical losses (light absorption losses) are likely to occur when laser oscillation is effected through current injection. However, according to the present invention, a desired doping profile at the interface can be created with a high controllability and a high steepness, and therefore a laser device having very low light absorption losses can be provided with a good production yield.

Note that one conceivable method for realizing a steep doping profile by beginning Mg doping in a p-GaN layer might be to provide excess amounts of Mg supply only at the doping interface, thus to suppress doping lags. However, adhesion to the pipes and the inner walls of the reactor cannot be reduced, and doping lags will occur, again due to the memory effect. In the AlGaN electron overflow suppression layer, conversely, the Mg (which is an acceptor impurity) will be taken in excessively (e.g., to an Mg concentration of $1 \times 10^{20}$ cm$^{-3}$ or more). As a result, the acceptor will be compensated for to cause high resistance, thus leading to poor controllability.

It might also be possible to modify the crystal growth apparatus to one that has a pipe/reactor structure which is not prone to the memory effect, but this will result in enormous costs, required time, etc.

In contrast, according to the present invention, controllability of the Mg doping can be easily improved without employing any special apparatus modifications or techniques.

In order to obtain the effects of the present invention, it is important to perform Mg doping while efficiently forming a complex of Al and Mg. When performing Mg doping, it will be desirable if not only H$_2$ but also N$_2$ is contained as a carrier gas, because reactivity will be enhanced. In order to enhance the reactivity, it will also be effective to add small amounts of impurities, such as oxygen, carbon, or silicon, to an extent where the electrical characteristics of the laser structure are not affected.

In the case where a conventional p-GaN acceptor impurity doping start layer is employed, Mg will be easily diffused toward the active layer side due to a current applied during laser operation, or a heat or magnetic field that is applied to the laser. This invites the problem of light absorption losses occurring near the active layer, which unfavorably affects the laser reliability. In contrast, in the case where a laser structure is fabricated by employing a p-AlGaN acceptor impurity doping start layer, the bond between Al and Mg is strong also within the crystal, so that Mg diffusion is not likely to occur during laser operation.

Furthermore, in the case where a conventional p-GaN acceptor impurity doping start layer is employed, the Mg which has adhered to the pipes of the crystal growth apparatus and the inner walls of the reactor will remain even after the crystal growth, and gradually mix into the n-type layer during the following fabrication of the laser structure, whereby the n-type donor impurity will be compensated for and cause high resistance. In contrast, this influence can be suppressed when a laser structure is fabricated by employing a p-AlGaN acceptor impurity doping start layer.

Although a GaN substrate is employed in the present embodiment, the substrate is not limited to GaN, but may be: a nitride semiconductor bulk substrate such as AlGaN, InGaN, or AlGaInN; a sapphire substrate; a silicon carbide substrate; a silicon substrate; a gallium arsenide substrate having GaN grown on its surface; or an ELO-GaN substrate which has been fabricated via lateral epitaxial overgrowth.

In the present embodiment, a bulk crystal of AlGaN is employed as the n-type cladding layer and a superlattice structure composed of AlGaN and GaN is employed as the p-type cladding layer. However, a bulk crystal of AlGaN may be employed as the p-type cladding layer, and a superlattice structure composed of AlGaN and GaN may be employed as the n-type cladding layer. Alternatively, a bulk crystal of AlGaN or a superlattice structure composed of AlGaN and GaN may be employed for both of the n-type and the p-type. Furthermore, these semiconductor layers may contain In, boron (B), arsenic (As), phosphorus (P), so long as a structure is obtained which can effectively realize light and carrier confinement.

Although the present embodiment employs TMG as a Ga source, TMA as an Al source, TMI as an In source, $Cp_2Mg$ as an Mg source, and $NH_3$ as an N source, the source gases are not limited thereto. Triethylgallium (TEG) or gallium chloride (GaCl or $CaCl_3$) may be used as a Ga source; triethylaluminum (TEA), dimethylaluminum hydride (DMAH), dimethylaluminum chloride (DMACl), or trimethylaminealane (TMAA) may be used as an Al source; triethylindium (TEI) may be used as an In source; bis(ethylcyclopentadienyl)magnesium ($EtCp_2Mg$) or bis methylcyclopentadienyl magnesium ($MeCp_2Mg$) may be used as an Mg source; and hydrazine ($N_2H_4$), monomethylhydrazine (MMH), or dimethylhydrazine (DMH) may be used as an N source. In particular, in order to effectively realize the present invention, it is important that a complex of Al and Mg be formed efficiently, with which Mg doping is performed. Since those with greater molecular weights will act more effectively in the formation of this complex, it will be further desirable to employ source materials which have as large molecular weights as possible within the usable range.

(Embodiment 2)

In the present embodiment, after a semiconductor multilayer structure is formed similarly to Embodiment 1, this multilayer structure is processed into a stripe shape through a dry etching process. At this time, from the surface side, the p-GaN contact layer 412, the p-$Al_{0.10}Ga_{0.90}$N/p-GaN-SLs cladding layer 411, the p-$Al_{0.16}Ga_{0.84}$N electron overflow suppression layer 410, and the p-$Al_{0.03}Ga_{0.97}$N acceptor impurity doping start layer 409 are sequentially etched, almost until the non-doped $Al_{0.03}Ga_{0.97}$N intermediate layer 408 is exposed. The etching depth is an important parameter that determines the laser kink level and beam shape, and it is desirable to finely control the etching depth.

Monitor windows for optical evaluation, each being 50 μm per side, were provided in several places on the laser structure epitaxial wafer, and optical evaluations were performed in situ while conducting a dry etching process; thus, a dry etching was carried out.

In the present embodiment, photoluminescence measurements were taken as a means of optical evaluation. A helium-cadmium laser having a wavelength of 325 nm was used for the photoluminescence evaluation. In a compound semiconductor doped with a p-type acceptor impurity, a p-type acceptor impurity level is formed and donor-acceptor pair emission is observed. In a compound semiconductor which is not doped with a p-type acceptor impurity, emission from near the band edges is mainly observed. In the conventional technique which does not employ the p-$Al_{0.03}Ga_{0.97}$N acceptor impurity doping start layer 409, the doping profile of the p-type acceptor was draped, and the doping interface was unclear; therefore, it was impossible to determine a doping interface from the optical evaluation.

However, by employing the p-$Al_{0.03}Ga_{0.97}$N acceptor impurity doping start layer 409 in the manner of Embodiment 1, the steepness of the doping interface was improved, and it was easy to control film thickness through optical evaluation. It will be appreciated that the control method is not limited to photoluminescence measurements, but any technique that enables evaluation can be used, e.g., plasma emission analysis. There are no limitations as to the shape and size of the monitor windows for optical evaluation, so long as the device production yield is not lowered within the wafer and that optical evaluation is enabled.

Moreover, photoluminescence measurements taken through the monitor windows for optical evaluation after completion of etching made it possible to evaluate the emission wavelength of the active layer, and also made it possible to conduct product evaluations of the laser structure prior to the laser process; thus, the device process was made more efficient.

(Embodiment 3)

Figure 7:
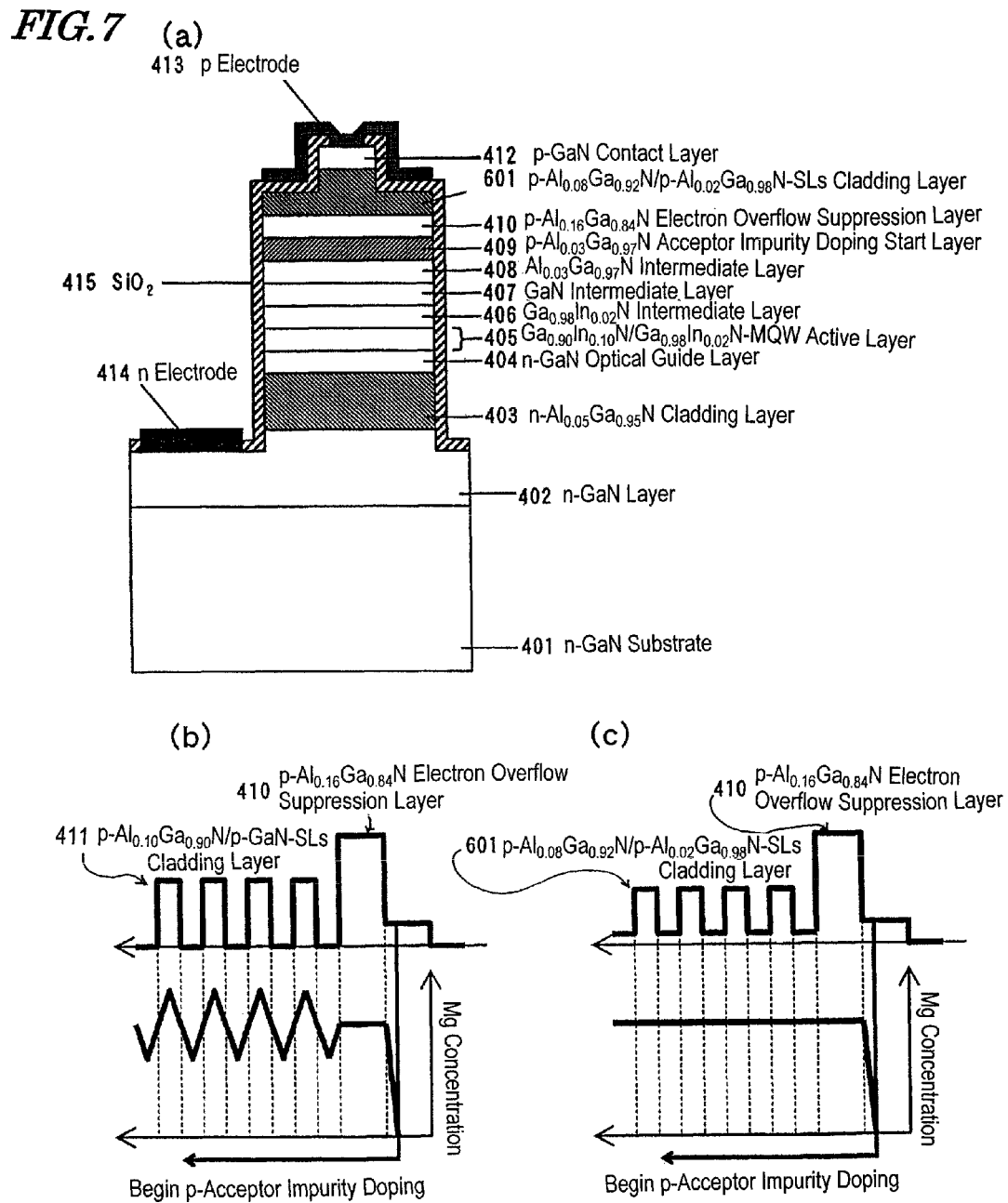
FIG. 7(a) is a cross-sectional view showing a semiconductor laser according to Embodiment 3 of the present invention.
FIG. 7(b) is a schematic diagram showing a conduction-band structure of a comparative example.
FIG. 7(c) is a schematic diagram of a conduction-band structure in this embodiment.

Crystal growth for a laser structure was performed by using a construction similar to that of Embodiment 1, except for the structure of the p-type cladding layer. While Embodiment 1 employed the p-$Al_{0.10}Ga_{0.90}$N/p-GaN-SLs cladding layer 411, herein a p-$Al_{0.08}Ga_{0.92}$N/p-$Al_{0.02}Ga_{0.98}$N-SLs cladding layer 601 is used instead. FIG. 7(a) shows a structural diagram of this laser structure.

In the case where the p-$Al_{0.10}Ga_{0.90}$N/p-GaN-SLs cladding layer 411 is employed, supply/non-supply of TMA is periodically repeated to form AlGaN layers and GaN layers. If a uniform Mg doping is performed, the amount of Mg take-in will be reduced during the formation of the GaN layers, due to the memory effect. Conversely, when the AlGaN layers are formed, the amount of Mg take-in will rapidly increase near the interface. This will result in repetitive changes, each time stabilized at a constant value. Thus, as shown in FIG. 7(b), the Mg concentration is not stabilized within the cladding layer, but repeats increasing and decreasing, whereby the reproducibility of the laser structure with respect to low-voltage operation is degraded.

In contrast, when the p-$Al_{0.08}Ga_{0.92}$N/p-$Al_{0.02}Ga_{0.98}$N-SLs cladding layer 601 is used, TMA is always being supplied, whereby the influence of the memory effect can be reduced. Therefore, the Mg concentration in the cladding layer can be controlled to a constant value with a good reproducibility, as shown in FIG. 7(c). Thus, reduction of the operating voltage can be realized with a high controllability.

(Embodiment 4)

Figure 8:
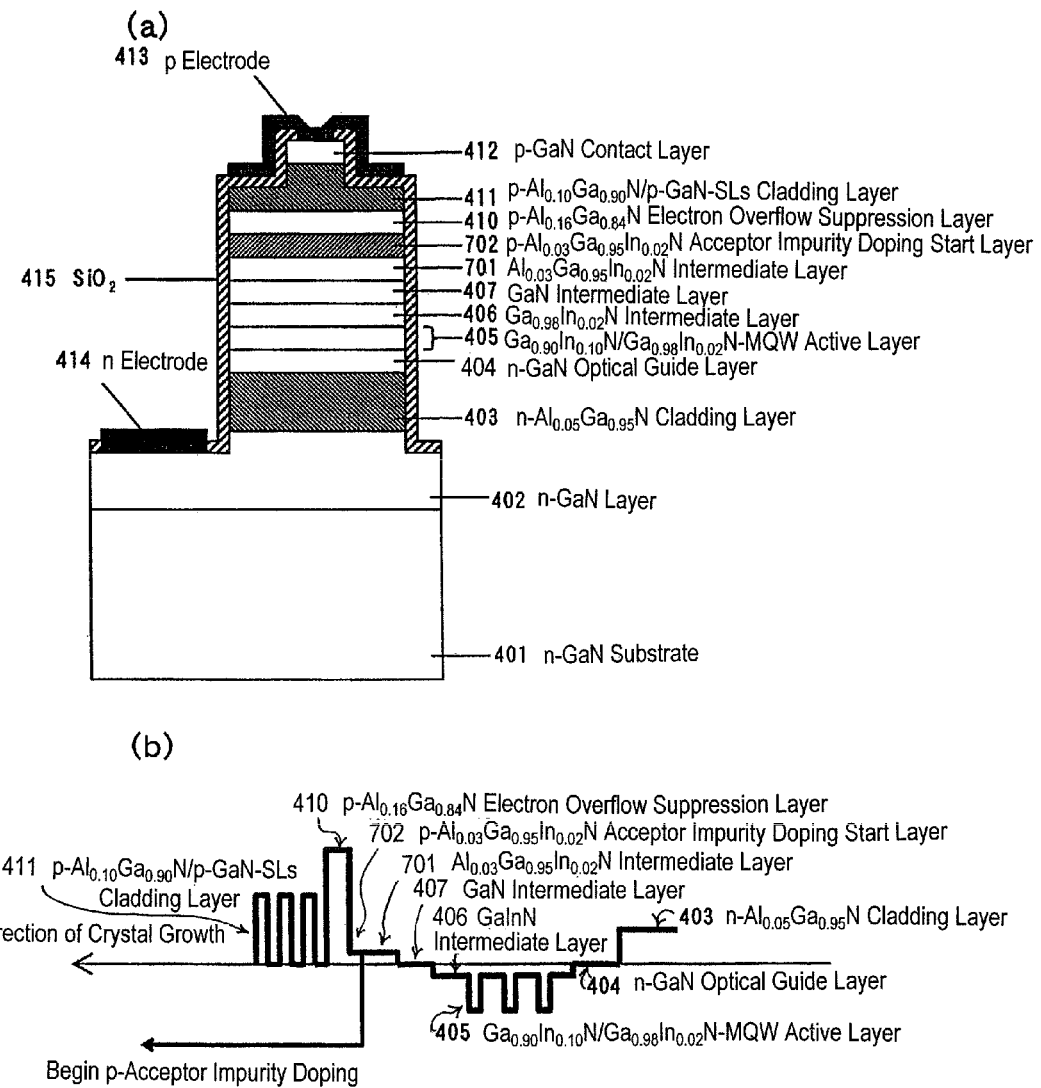
FIG. 8(a) is a cross-sectional view showing a semiconductor laser according to Embodiment 4 of the present invention.
FIG. 8(b) is a schematic diagram of a conduction-band structure thereof.

Hereinafter, with reference to FIGS. 8(a) and (b), a fourth embodiment of the nitride semiconductor device according to the present invention will be described. The semiconductor laser of the present embodiment has a similar structure to the structure of the semiconductor laser shown in FIG. 4(a) (Embodiment 1), except for the below-described portions: specifically, instead of the non-doped $Al_{0.03}Ga_{0.97}N$ intermediate layer 408 having a thickness of 40 nm and the p-$Al_{0.03}Ga_{0.97}N$-acceptor impurity doping start layer 409 having a thickness of 5 nm of Embodiment 1, a non-doped $Al_{0.03}Ga_{0.95}In_{0.02}N$ intermediate layer 701 having a thickness of 40 nm and a p-$Al_{0.03}Ga_{0.95}In_{0.02}N$ acceptor impurity doping start layer 702 having a thickness of 5 nm are comprised.

The Al mole fractions in these layers are made equal between the present embodiment and Embodiment 1, and therefore there is no difference in the Mg doping profiles. However, the band gap energy is smaller due to the inclusion of In. As a result, the impurity activation energy is smaller and the hole concentration is higher in these layers. Moreover, there is a smaller strain imposed on the active layer. Therefore, according to the present embodiment, a further reduction of the threshold current and a further improvement in reliability can be realized.

(Embodiment 5)

Figure 9:
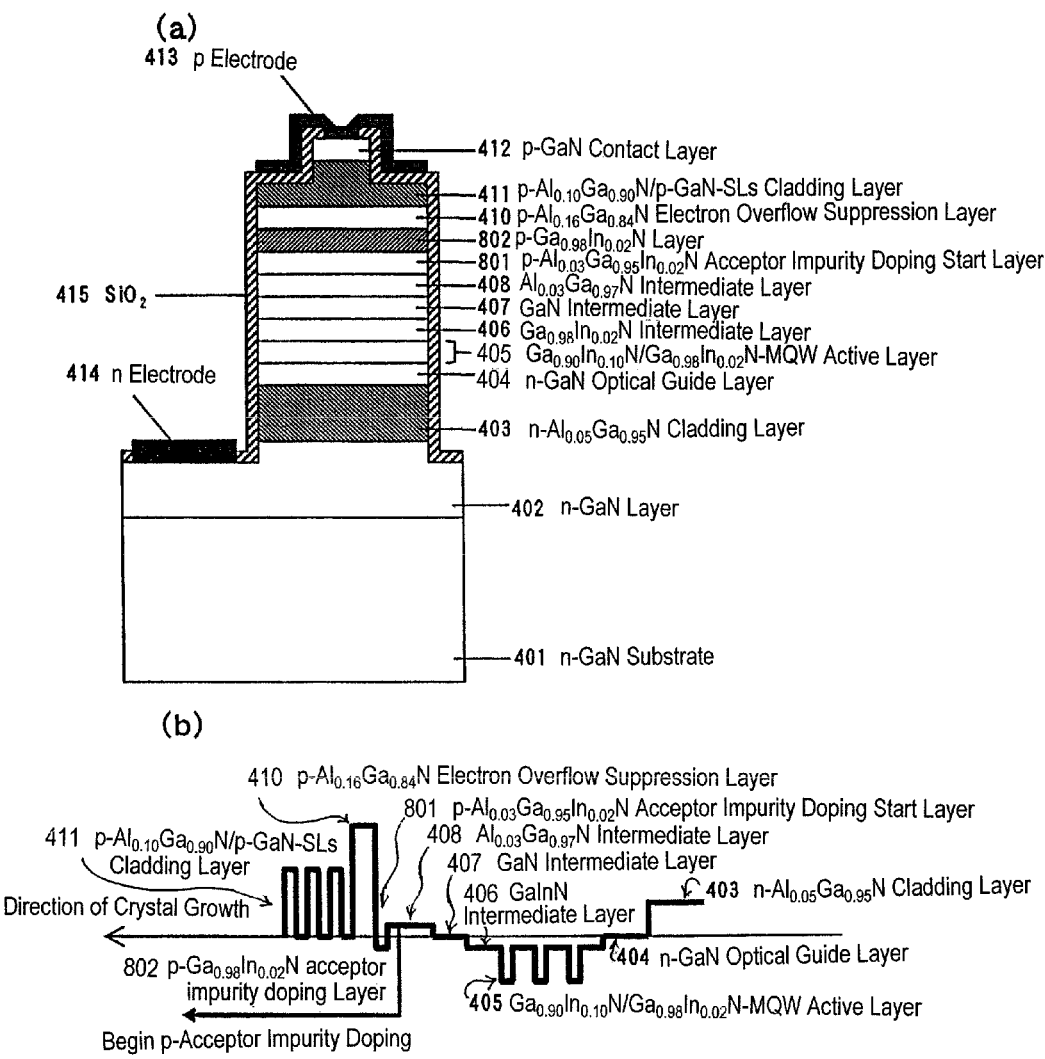
FIG. 9(a) is a cross-sectional view showing a semiconductor laser according to Embodiment 5 of the present invention.
FIG. 9(b) is a schematic diagram of a conduction-band structure thereof.

Hereinafter, with reference to FIGS. 9(a) and (b), a fifth embodiment of the nitride semiconductor device according to the present invention will be described. The semiconductor laser of the present embodiment has a similar structure to the structure of the semiconductor laser shown in FIG. 4(a) (Embodiment 1), except for the below-described portion: specifically, instead of the p-$Al_{0.03}Ga_{0.97}N$-acceptor impurity doping start layer 409 having a thickness of 5 nm of Embodiment 1, a p-$Al_{0.03}Ga_{0.95}In_{0.02}N$ acceptor impurity doping start layer 801 having a thickness of 5 nm and a p-$Ga_{0.98}In_{0.02}N$ layer 802 having a thickness of 5 nm are comprised in the present embodiment.

The Al mole fraction of the Mg doping start layer 801 is made equal in both embodiments, and therefore there is no difference in the Mg doping profiles. However, in the present embodiment, the distance between the MQW active layer 405 and the p-$Al_{0.16}Ga_{0.84}N$ electron overflow suppression layer 410 is longer due to the insertion of the p-$Ga_{0.98}In_{0.02}N$ layer 802. However again, since the p-$Ga_{0.98}In_{0.02}N$ layer 802 having a thickness of 5 nm contains In, its band gap energy is smaller than the band gap energy of GaN, and as a result has a very high hole concentration. Therefore, the efficiency of hole injection to the active layer 405 is improved, and a further reduction of the threshold current and a further improvement in reliability can be realized.

(Embodiment 6)

Figure 10:
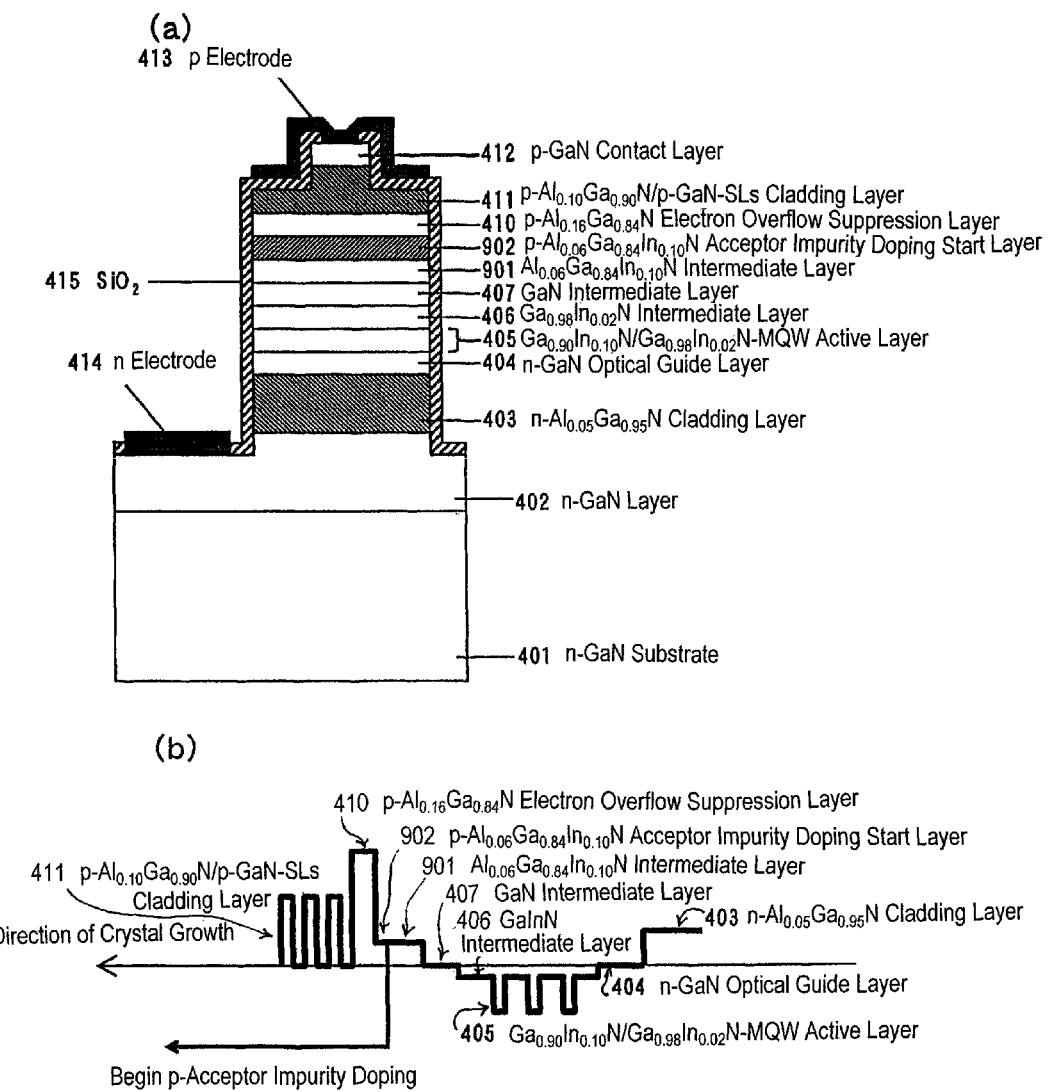
FIG. 10(a) is a cross-sectional view showing a semiconductor laser according to Embodiment 6 of the present invention.
FIG. 10(b) is a schematic diagram of a conduction-band structure thereof.

Hereinafter, with reference to FIGS. 10(a) and (b), a sixth embodiment of the nitride semiconductor device according to the present invention will be described. The semiconductor laser of the present embodiment has a similar structure to the structure of the semiconductor laser shown in FIG. 4(a) (Embodiment 1), except for the below-described portions: specifically, instead of the non-doped $Al_{0.03}Ga_{0.97}N$ intermediate layer 408 having a thickness of 40 nm and the p-$Al_{0.03}Ga_{0.97}N$ acceptor impurity doping start layer 409 having a thickness of 5 nm in the semiconductor laser of FIG. 4(a), a non-doped $Al_{0.06}Ga_{0.84}In_{0.10}N$ intermediate layer 901 having a thickness of 40 nm and a p-$Al_{0.06}Ga_{0.84}In_{0.10}N$ acceptor impurity doping start layer 902 having a thickness of 3 nm are comprised in the present embodiment.

In the present embodiment, the Al mole fractions in the intermediate layer 901 and the acceptor impurity doping start layer 902 are higher than the respective Al mole fractions in the intermediate layer 408 and the acceptor impurity doping start layer 409 in Embodiment 1. As a result, the Mg doping profile rises more steeply, and therefore the p-$Al_{0.06}Ga_{0.84}In_{0.10}N$ acceptor impurity doping start layer 902 can be made thinner.

Moreover, the p-$Al_{0.06}Ga_{0.84}In_{0.10}N$ acceptor impurity doping start layer 902 of the present embodiment has a lattice match with GaN, and therefore the strain imposed on the active layer 405 can be made smaller than in Embodiment 1. As a result, an even higher output and a further improvement in reliability can be realized.

(Embodiment 7)

Figure 11:
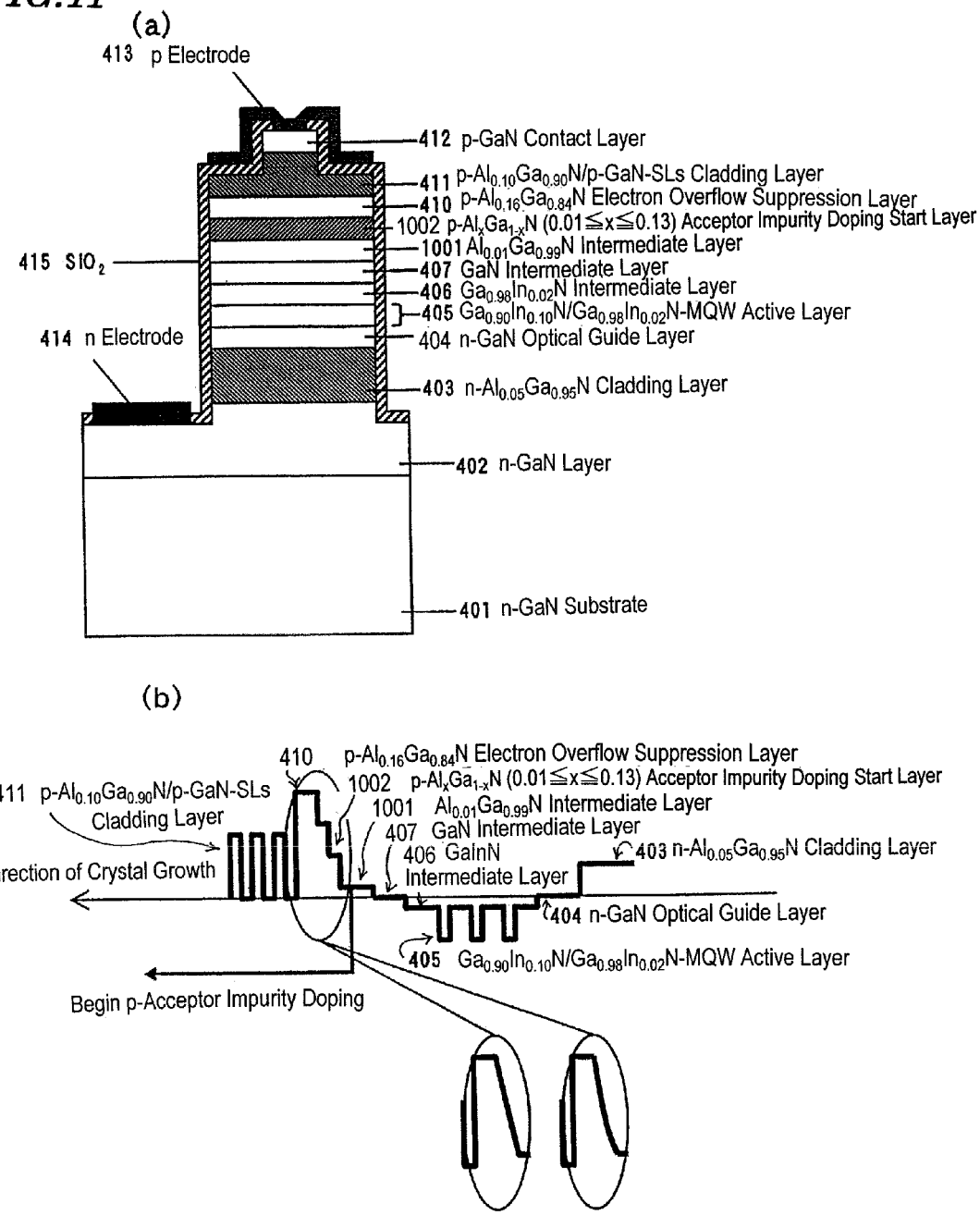
FIG. 11(a) is a cross-sectional view showing a semiconductor laser according to Embodiment 7 of the present invention.
FIG. 11(b) is a schematic diagram of a conduction-band structure thereof.

Hereinafter, with reference to FIGS. 11(a) and (b), a seventh embodiment of the nitride semiconductor device according to the present invention will be described. The semiconductor laser of the present embodiment has a similar structure to the structure of the semiconductor laser shown in FIG. 4(a) (Embodiment 1), except for the below-described portions: specifically, instead of the non-doped $Al_{0.03}Ga_{0.97}N$ intermediate layer 408 having a thickness of 40 nm and the p-$Al_{0.03}Ga_{0.97}N$-acceptor impurity doping start layer 409 having a thickness of 5 nm, a non-doped $Al_{0.01}Ga_0$ intermediate layer 1001 having a thickness of 40 nm and an $Al_xGa_{1-x}N$ ($0.01 \leq x \leq 0.13$) acceptor impurity doping start layer 1002 having a thickness of 5 nm, whose Al mole fraction increases in a stepwise manner by 0.03 from 0.01 to 0.13 per every nm, are comprised in the present embodiment.

In the present embodiment, the Al mole fraction of the $Al_xGa_{1-x}N$ ($0.01 \leq x \leq 0.13$) acceptor impurity doping start layer 1002 is increased in a stepwise manner, thus allowing the Mg doping profile to rise even more steeply.

Moreover, according to the present embodiment, the lattice strain associated with lattice constant differences can be suppressed. As a result, reduction in the stress imposed on the active layer and reduction in the notches associated with band discontinuities can be realized.

Furthermore, since the influence of piezoelectric field effects occurring due to compressive stress can be effectively reduced, the efficiency of hole injection to the active layer is enhanced. Therefore, a further reduction of the threshold current, a further improvement in reliability, and a further improvement in production yield can be realized.

In the present embodiment, the $Al_xGa_{1-x}N$ ($0.01 \leq x \leq 0.13$) acceptor impurity doping start layer 1002 having a thickness of 5 nm is formed in such a manner that its Al mole fraction increases in a stepwise manner by 0.03 from 0.01 to 0.13 per every nm. However, the effects therefrom are obtained not only in the case where the Al mole fraction is increased in a stepwise manner. As shown enlarged in a portion of FIG. 11(b), also through gradually increasing or parabolically increasing the Al mole fraction, the strain associated with lattice constant differences can be greatly reduced, and notches associated with band discontinuities can be completely suppressed.

As described above, with the nitride semiconductor device according to the present invention, the efficiency of carrier confinement by the second p-type nitride semiconductor layer can be improved. Thus, it is no longer necessary to attach importance to the carrier confinement by a third p-type nitride semiconductor layer functioning as a cladding layer. This makes it permissible to reduce the band gap of the cladding layer (third p-type nitride semiconductor layer), which in turn makes it possible to reduce the Al mole fraction of the cladding layer. In the embodiments described below, the Al mole fraction of the cladding layer (third p-type nitride semiconductor layer) is reduced as compared to each of the above-described embodiments, so that its band gap is prescribed to be smaller than the band gap of the first p-type nitride semiconductor layer. The reduction in the Al mole fraction of the third p-type nitride semiconductor layer functioning as a cladding layer reduces the serial resistance Rs of the nitride semiconductor device, which makes possible a reduction in power consumption.

(Embodiment 8)

Figure 12:
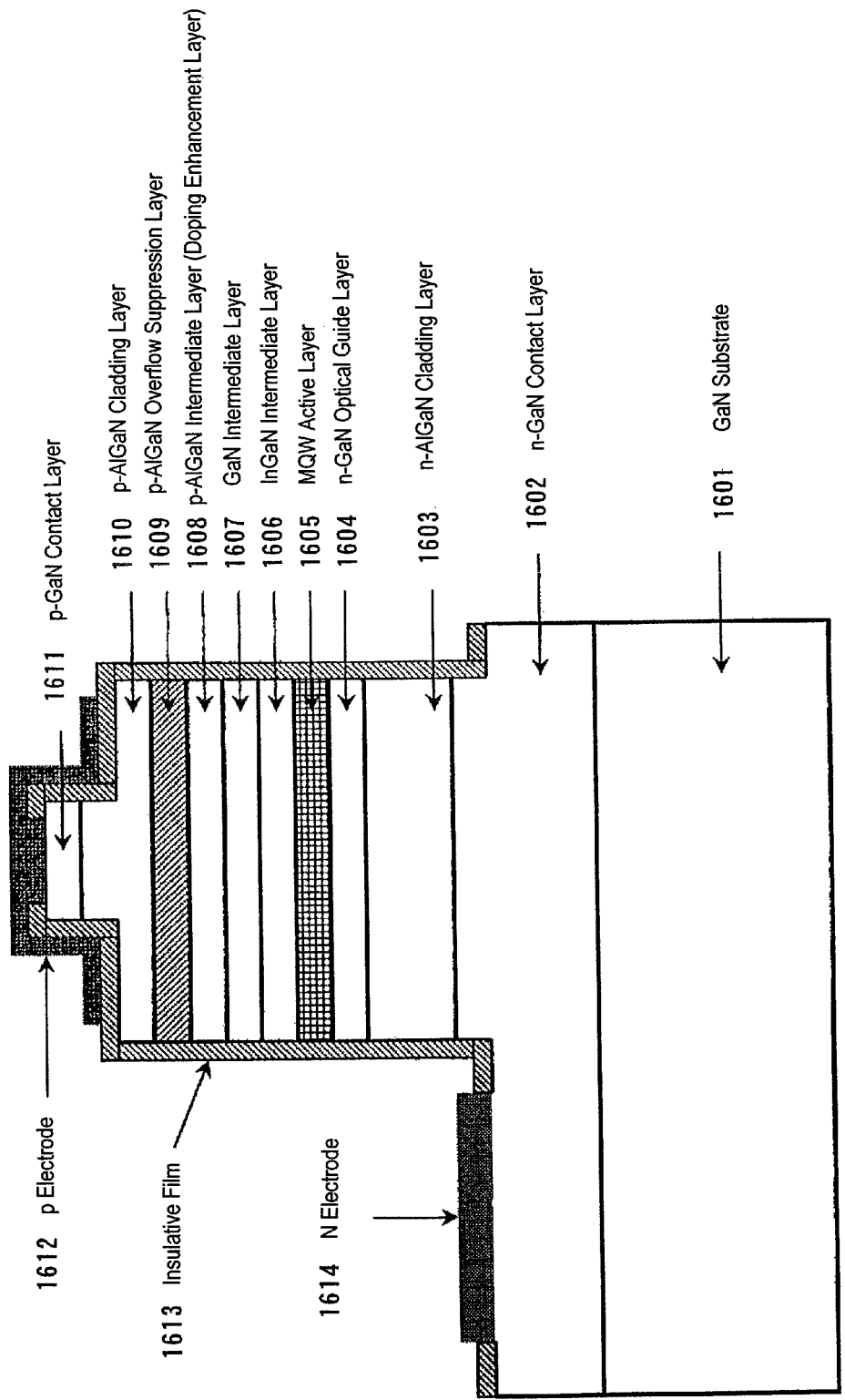
FIG. 12 is a cross-sectional view showing a semiconductor laser according to Embodiment 8 of the present invention.

Hereinafter, with reference to FIG. 12, an eighth embodiment of the nitride semiconductor device according to the present invention will be described.

First, an n-GaN substrate 1601 is prepared. After its surface is cleaned with an organic solvent and an acid, the substrate 1601 is placed on a susceptor within a growth furnace. After the interior of the growth furnace is sufficiently substituted with an $N_2$ gas, it is heated to 1000° C. with a heating rate of 1° C./second, and the carrier gas is switched to $H_2$ and also ammonia ($NH_3$) begins to be supplied to clean the substrate surface. It is desirable to perform this cleaning for a period of 1 minute or more. Thereafter, trimethylgallium (TMG) and monosilane ($SiH_4$) begin to be supplied to grow an n-GaN layer 1602 having a thickness of 2 μm, and then trimethylaluminum (TMA) is added to grow an n-$Al_{0.05}Ga_{0.95}N$ cladding layer 1603 having a thickness of 1.5 μm. Next, after the TMA supply is stopped and an n-GaN optical guide layer 1604 is grown to 0.1 μm, the carrier gas is changed to $N_2$, the $NH_3$ supply is stopped, and the growth temperature is lowered to 780° C.

Next, by supplying $NH_3$, TMG and trimethylindium (TMI), three periods of semiconductor layers are grown on the optical guide layer 1604, where one period consists of an $In_{0.1}Ga_{0.9}N$ well layer having a thickness of about 3 nm and an $In_{0.02}Ga_{0.98}N$ barrier layer (on the well layer) having a thickness of about 7 nm. Thus, a multiple quantum well (MQW) active layer 1605 is formed.

Next, a non-doped $In_{0.02}Ga_{0.98}N$ intermediate layer 1606 having a thickness of 30 nm is grown, and after a non-doped GaN intermediate layer 1607 having a thickness of 30 nm is grown, the TMG supply is stopped. While supplying $N_2$ and $NH_3$, a quick heating to 1000° C. is performed, and the carrier gas is switched to a gaseous mixture of $N_2$ and $H_2$. The supply of TMG and TMA is restarted, and a p-$Al_{0.10}Ga_{0.90}N$ intermediate layer (doping enhancement layer) 1608 having a thickness of 45 nm is grown.

When starting the growth of the doping enhancement layer 1608, or in the middle of the growth, an Mg doping with bis(cyclopentadienyl)magnesium ($Cp_2Mg$) is begun.

If Mg doping is begun in the middle of the growth, i.e., after beginning the growth of the doping enhancement layer 1608, an $Al_{0.10}Ga_{0.90}N$ lower layer portion which is not doped with Mg and an $Al_{0.10}Ga_{0.90}N$ upper layer portion which is doped with Mg will be formed in the doping enhancement layer 1608. In other words, the doping enhancement layer 1608 is now structured so as to include both the non-doped $Al_{0.10}Ga_{0.90}N$ lower layer portion and the Mg-doped $Al_{0.10}Ga_{0.90}N$ upper layer portion. In this case, the non-doped $Al_{0.10}Ga_{0.90}N$ lower layer portion corresponds to the $Al_{0.03}Ga_{0.97}N$ intermediate layer 408 in Embodiment 1, whereas the Mg-doped $Al_{0.10}Ga_{0.90}N$ upper layer portion corresponds to the p-$Al_{0.03}Ga_{0.97}N$ acceptor impurity doping start layer 409 in Embodiment 1.

Note that, also in the case where Mg doping is begun simultaneously with beginning the growth of the doping enhancement layer 1608, the non-doped $Al_{0.10}Ga_{0.90}N$ lower layer portion will be formed due to a doping lag.

Thus, a region which is not doped with Mg can be formed in a part of the doping enhancement layer 1608, but the entirety of the doping enhancement layer 1608 can be doped with Mg through a thermal diffusion of Mg which takes place in subsequent steps.

Note that, the portion of the doping enhancement layer 1608 that is doped with Mg functions as the first p-type nitride semiconductor layer according to the present invention.

After the doping enhancement layer 1608 is formed, a p-$Al_{0.16}Ga_{0.84}N$ electron overflow suppression layer 1609 having a thickness of 10 nm is grown. The p-$Al_{0.16}Ga_{0.84}N$ electron overflow suppression layer 1609 functions as the second p-type nitride semiconductor layer according to the present invention.

After the p-$Al_{0.16}Ga_{0.84}N$ electron overflow suppression layer 1609 is grown, the carrier gas is quickly switched to $H_2$, and a p-$Al_{0.03}Ga_{0.97}N$ cladding layer 1610 is grown and thereafter p-GaN contact layer 11611 having a thickness of 50 nm is stacked in turn.

Although magnesium (Mg) is used as a p-type dopant in the present embodiment, besides Mg, any p-type dopant such as carbon (C), zinc (Zn), beryllium (Be) or cadmium (Cd) may be added.

The nitride semiconductor growing method is not limited to the MOVPE technique. All methods which have hitherto been proposed for growing a compound semiconductor crystal, e.g., hydride vapor phase epitaxy (HYPE technique) or molecular beam epitaxy (MBE technique), can be adopted.

In the present embodiment, TMG is used as a Ga source; TMA as an Al source; TMI as an In source; $Cp_2Mg$ as an Mg source; and $NH_3$ as an N source. However, the source gases are not limited thereto, so long as the crystal growth utilizes the principles under the aforementioned conditions. Triethylgallium (TEG) or gallium chloride (GaCl or $CaCl_3$) may be used as the Ga source; triethylaluminum (TEA), dimethylaluminum hydride (DMAH), or dimethylaluminum chloride (DMACl) may be used as the Al source; triethylindium (TEI) may be used as the In source; bis ethylcyclopentadienyl magnesium ($EtCp_2Mg$) or bis methylcyclopentadienyl magnesium ($MeCp_2Mg$) may be used as the Mg source; and hydrazine ($N_2H_4$) or monomethylhydrazine (MMH) dimethylhydrazine (DMH) may be used as the N source.

Although the present embodiment employs a bulk crystal for each cladding layer, contact layer, and the like, a superlattice structure may instead be adopted.

Next, through etching, a portion to become a resonator-forming region is dug in, until reaching the p-$Al_{0.10}Ga_{0.90}N$ intermediate layer (doping enhancement layer) 1608, whereby a stripe shape is obtained a ridge portion is formed above the resonator-forming region. The stripe width over the ridge portion is about 2 to 3 μm. The stripe-shaped resonator-forming region in the epitaxial layer is masked, and the epitaxial layer is etched until a portion of the n-type contact layer 1602 is exposed.

Next, a portion of the upper face of the p-type contact layer to come into contact with an electrode and a portion of the upper face of the n-type contact layer to come into contact with an electrode are masked, and by a CVD technique or the like, a protective insulating film 1613 composed of silicon oxide ($SiO_2$) is deposited on both sides of the ridge portion, thus forming a current injection region. In an aperture of the insulating film, a p electrode 1612 is formed on the surface of the p-GaN contact layer 1611, and an n electrode 1614 is formed on the surface of the n-GaN contact layer 1602. The Mg concentration in the p-GaN contact layer 1611 is prescribed to be from $1 \times 10^{20}$ $cm^{-3}$ to $5 \times 10^{20}$ $cm^{-3}$ in order to reduce the contact resistance with the p electrode 1612. Thus, a nitride semiconductor laser as shown in FIG. 12 can be fabricated.

Although the n-side electrode is formed on the upper face (i.e., the same side as the p-side electrode) in the present embodiment, the n electrode may be formed on the back face of the n-GaN substrate, thus achieving electrical conduction from above and below.

In the semiconductor laser which is thus obtained, when a voltage is applied between the p-side electrode 1612 and the n-side electrode 1614, holes will be injected from the p-side electrode 1612 and electrons will be injected from the n-side electrode 1614 into the MQW active layer 1605. As a result, an optical gain is created in the MQW active layer 1605 due to recombination of holes and electrons, thus causing laser oscillation at a wavelength of about 410 nm.

Hereinafter, the effectiveness of the Al mole fraction (band gap) of the p-$Al_{0.10}Ga_{0.90}N$ intermediate layer (doping enhancement layer) 1608 being smaller than that of the p-$Al_{0.16}Ga_{0.84}N$ overflow suppression layer 1609 and greater than that of the p-$Al_{0.03}Ga_{0.97}N$ cladding layer 1610 will be described.

Figure 13:
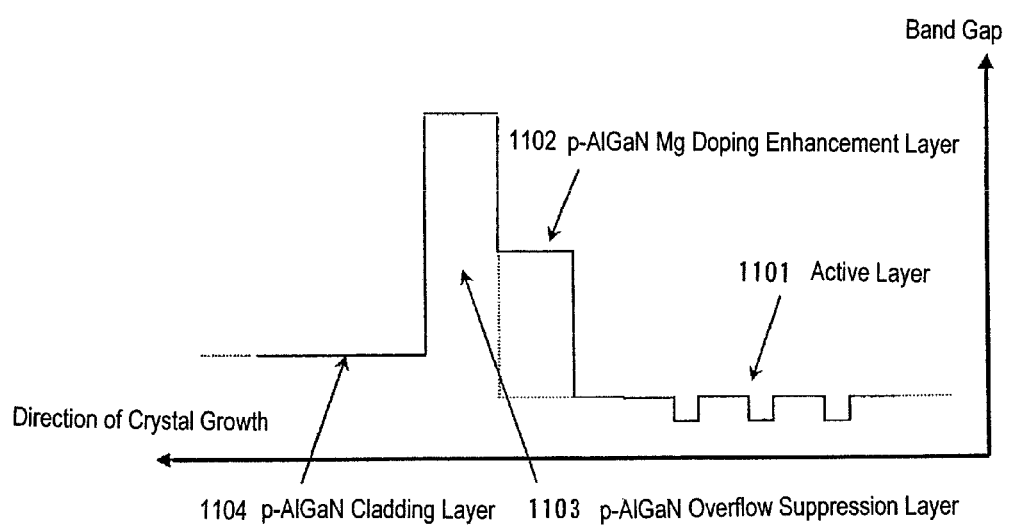
FIG. 13 is a schematic diagram showing a conduction-band structure near an active layer of the semiconductor laser of Embodiment 8.

FIG. 13 is a diagram showing a structure near the active layer according to the present embodiment. From the active layer side, it is composed of three or more regions of layers differing in their film thickness and Al mole fraction (band gap).

In the present embodiment, the portion of the p-AlGaN doping enhancement layer 1102 which is doped with Mg corresponds to the first p-type nitride semiconductor layer. Furthermore, the p-AlGaN overflow suppression layer 1103 corresponds to the second p-type nitride semiconductor layer, whereas the p-AlGaN cladding layers 1104 corresponds to the third p-type nitride semiconductor layer. The Al mole fraction of the first p-type nitride semiconductor layer is prescribed to be higher than the mole fraction of the third p-type nitride semiconductor layer, and the Al mole fraction of the second p-type nitride semiconductor layer is prescribed to be higher than that of the third p-type nitride semiconductor layer. As a result, in terms of band gap, the following relationship is satisfied: second p-type nitride semiconductor layer>first p-type nitride semiconductor layer>third p-type nitride semiconductor layer.

It is desirable that the Al mole fraction of the first p-type nitride semiconductor layer is as high as possible, so long as its band gap is smaller than that of the second p-type nitride semiconductor layer. The existence of the first p-type nitride semiconductor layer eliminates doping lags of the p-type impurity, and guarantees a sufficient impurity concentration for the second p-type nitride semiconductor layer.

The desirable Al mole fraction is 5 to 20% for the first p-type nitride semiconductor layer, 10 to 30% for the second p-type nitride semiconductor layer, and 3 to 9% (on average) for the third p-type nitride semiconductor layer. The most desirable Al mole fraction is 6 to 12% for the first p-type nitride semiconductor layer, 15 to 20% for the second p-type nitride semiconductor layer, and 3.5 to 5.5% (on average) for the third p-type nitride semiconductor layer. When the layers having high Al mole fractions (e.g. the first p-type nitride semiconductor layer and the second p-type nitride semiconductor layer) are constructed so as to be thick, an increase in the serial resistance will result; therefore, their film thicknesses must be made smaller than that of the third p-type nitride semiconductor layer. Accordingly, the desirable film thickness of each layer is 1 to 50 nm for the first p-type nitride semiconductor layer, and 5 to 20 nm for the second p-type nitride semiconductor layer. The most desirable film thickness is 5 to 20 nm for the first p-type nitride semiconductor layer, and 5 to 10 nm for the second p-type nitride semiconductor layer.

Note that the Al mole fraction of the first p-type nitride semiconductor layer may have a gradient so long as it falls within the aforementioned desirable range of Al mole fraction. This gradient may be gradual or stepwise.

Moreover, each region may be a superlattice layer instead of a bulk layer, so long as it falls within the aforementioned desirable ranges of Al mole fraction and film thickness. Moreover, bulk layers and superlattice layers may both be present.

According to the present embodiment, it was experimentally confirmed that a high Mg concentration of $9 \times 10^{18}$ cm$^{-3}$ or more can be realized in the AlGaN overflow suppression layer 1103.

Although the start of doping falls at the beginning or in the middle of the growth of the doping enhancement layer 1102 in the present embodiment, it suffices if Mg doping is performed in a whole or a part of the doping enhancement layer 1102. It is not necessary for the Mg concentration in the doping enhancement layer 1102 to be uniform.

It is preferable that the p-type impurity concentration in the overflow suppression layer 1103 is, at the most, in the range from $8 \times 10^{18}$ cm$^{-3}$ to $2 \times 10^{19}$ cm$^{-3}$. It is also preferable that the impurity concentration distribution is uniform along the thickness direction.

Thus, insertion of the AlGaN doping enhancement layer 1102 makes it possible to suppress the influence of Mg doping lags. Therefore, the Mg concentration in the AlGaN overflow suppression layer 1103 having the largest band gap energy in the laser structure can be made substantially equal to the Mg concentration in the cladding layer. By Thus improving the hole injection efficiency, the threshold current can be reduced, and an increase in the operating voltage due to shifting of the pn junction position can be suppressed, for example. In particular, by implementing the doping enhancement layer 1102 as a superlattice layer, portions having a high Al concentration can be formed even if the average Al mole fraction may be the same, whereby the steepness of Mg take-in can be improved.

Note that, by implementing the overflow suppression layer 1103 as a superlattice layer, it becomes possible to reduce the activation energy of the Mg acceptor, whereby the serial resistance can be reduced. This effect can also be obtained with a p-$Al_{0.90}In_{0.10}N$ acceptor impurity doping start layer, which contains In instead of Ga, so long as at least Al is contained in the layer in which doping is begun.

Through such structural measures, if the overflow suppression layer can be adequately doped with a p-type dopant, carriers can be sufficiently blocked in this layer. As a result, it is hardly necessary to take carrier confinement in the cladding layers into consideration, and thus it is possible to reduce the Al mole fraction of the AlGaN cladding layer 1104. As for light confinement, the reduced Al mole fractions of the cladding layers can be made up for by increasing the thickness of the cladding layers.

Thus, by controlling the p-type dopant concentration through structural means, the carrier confinement can be improved, and low resistance can be realized by reducing the Al mole fractions of the cladding layers. As a result, the serial resistance of the device can be reduced, and the operating voltage can be lowered.

The present embodiment illustrates a laser structure on a GaN substrate. However, the crystal growth according to the present invention may be any crystal growth that utilizes the principles under the aforementioned conditions, and the substrate is not limited to GaN. It may be a nitride semiconductor bulk substrate such as AlGaN, InGaN or AlGaInN; a sapphire substrate or a silicon carbide substrate; a silicon substrate; GaN which is grown on a gallium arsenide substrate, etc., or may of course be an ELO-GaN substrate which is fabricated via lateral epitaxial overgrowth.

Although the present embodiment illustrates a laser device, the present embodiment is not limited thereto, but is also applicable to a light-emitting diode device. It is also applicable to all devices which have a pn junction and which require prevention of electron overflow and low resistance at the same time. Furthermore, the aforementioned effects will be true for BAlGaInN as well as general mixed-crystal compound semiconductors containing arsenic (As) or phosphorus (P).

(Embodiment 9)

Figure 14:
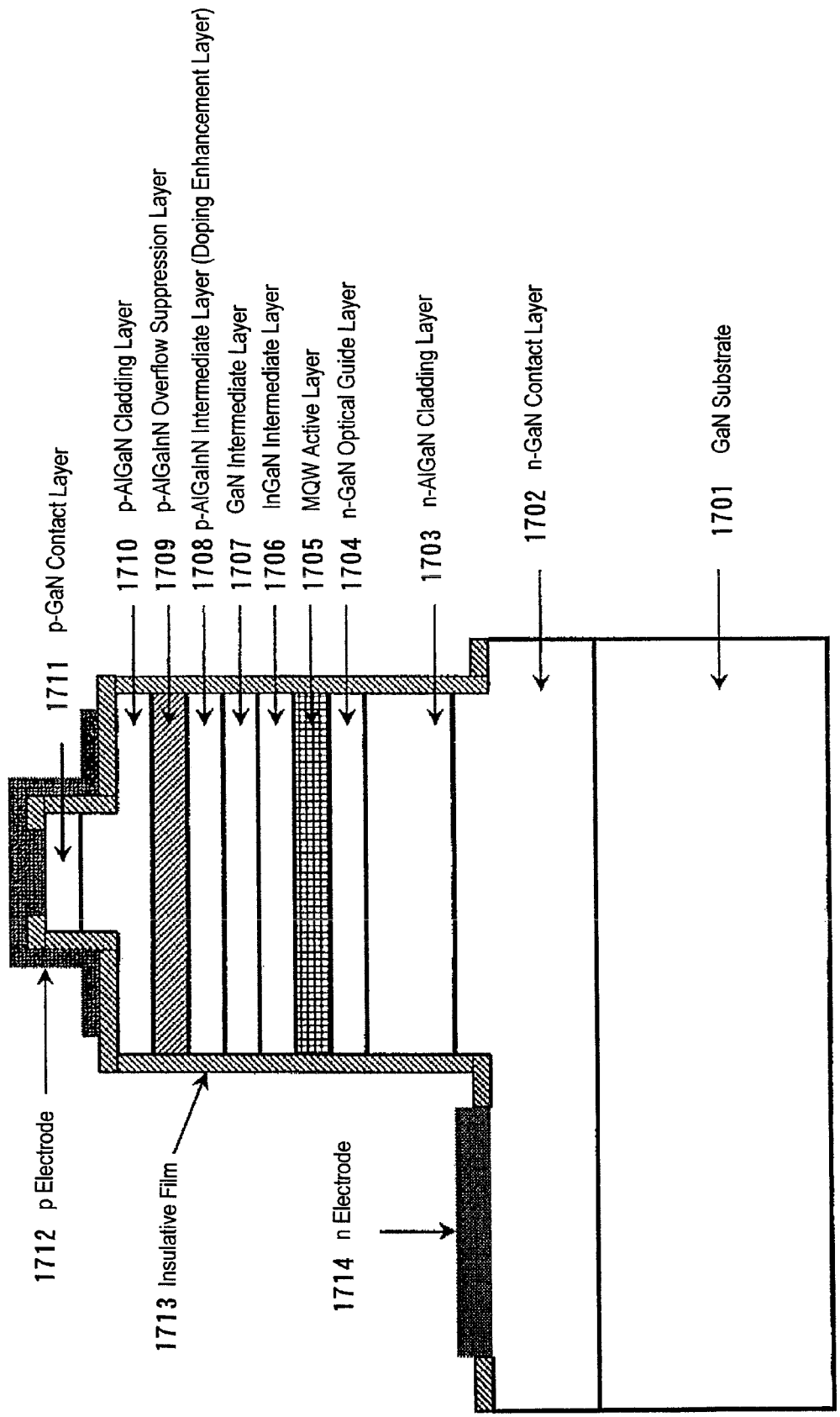
FIG. 14 is a cross-sectional view showing a semiconductor laser according to Embodiment 9 of the present invention.

With reference to FIG. 14, a ninth embodiment of the nitride semiconductor device according to the present invention will be described.

First, after the surface of an n-GaN substrate 1701 is cleaned with an organic solvent and an acid, the substrate 1701 is placed on a susceptor within a growth furnace. After the interior of the growth furnace is sufficiently substituted with an $N_2$ gas, it is heated to 1000° C. with a heating rate of 1° C./second, and the carrier gas is switched to $H_2$ and also ammonia ($NH_3$) begins to be supplied to cleaning the substrate surface. It is desirable to perform this cleaning for a period of 1 minute or more. Thereafter, trimethylgallium (TMG) and monosilane ($SiH_4$) begin to be supplied to grow an n-GaN layer 1702 having a thickness of 2 μm, and then trimethylaluminum (TMA) is added to grow an n-$Al_{0.05}Ga_{0.95}N$ cladding layer 1703 having a thickness of 1.5 μm. After the TMA supply is stopped and an n-GaN optical guide layer 1704 is grown to 0.1 μm, the carrier gas is changed to $N_2$, the $NH_3$ supply is stopped, and the growth temperature is lowered to 780° C.

Next, by supplying $NH_3$, TMG and trimethylindium (TMI), three periods of semiconductor layers are grown on the optical guide layer 1704, where one period consists of an $In_{0.1}Ga_{0.9}N$ well layer having a thickness of about 3 nm and an $In_{0.02}Ga_{0.98}N$ barrier layer (on the well layer) having a thickness of about 7 nm. Thus, a multi-quantum well (MQW) active layer 1705 is formed.

Next, after a non-doped $In_{0.02}Ga_{0.98}N$ intermediate layer 1706 having a thickness of 30 nm and a non-doped GaN intermediate layer 1707 having a thickness of 30 nm are grown, the TMG supply is stopped. While supplying $N_2$ and $NH_3$, a quick heating to 1000° C. is performed, and the carrier gas is switched to a gaseous mixture of $N_2$ and $H_2$. The supply of TMG and TMA, TMI is restarted, and a p-$Al_{0.10}Ga_{0.85}In_{0.05}N$ intermediate layer (doping enhancement layer) 1708 having a thickness of 45 nm is grown. In the middle of the growth of this intermediate layer, an Mg doping with bis(cyclopentadienyl)magnesium ($Cp_2Mg$) is begun. Then, after a p-$Al_{0.16}Ga_{0.75}In_{0.10}N$ overflow suppression layer 1709 having a thickness of 10 nm is grown, the carrier gas is quickly switched to $H_2$, and a p-$Al_{0.03}Ga_{0.97}N$ cladding layer 1710 and a p-GaN contact layer 1711 having a thickness of 50 nm are stacked in this order.

Thus, the epitaxial layer composing a semiconductor laser can be obtained. The ensuing fabricate steps for the nitride semiconductor laser are similar to those in Embodiment 8, and therefore the descriptions thereof are omitted.

Although magnesium (Mg) is used as a p-type dopant in the present embodiment, carbon (C), zinc (Zn), beryllium (Be), cadmium (Cd) or the like may be used instead.

Although the MOVPE technique is used as the nitride semiconductor growing method in the present embodiment, there is no limitation. All methods which have hitherto been proposed for growing a compound semiconductor crystal, e.g., hydride vapor phase epitaxy (HYPE technique) or molecular beam epitaxy (MBE technique), can be adopted.

In the present embodiment, TMG is used as a Ga source; TMA as an Al source; TMI as an In source; $Cp_2Mg$ as an Mg source; and $NH_3$ as an N source. However, there are no limitations so long as the crystal growth utilizes the principles under the aforementioned conditions. Triethylgallium (TEG) or gallium chloride (GaCl or $CaCl_3$) may be used as the Ga source; triethylaluminum (TEA), dimethylaluminum hydride (DMAH), or dimethylaluminum chloride (DMACl) may be used as the Al source; triethylindium (TEI) may be used as the In source; bis ethylcyclopentadienyl magnesium ($EtCp_2Mg$) or bis methylcyclopentadienyl magnesium ($MeCp_2Mg$) may be used as the Mg source; and hydrazine ($N_2H_4$), monomethylhydrazine (MMH), or dimethylhydrazine (DMH) may be used as the N source.

Although the present embodiment employs a bulk crystal for each cladding layer, contact layer, and the like, a superlattice structure may instead be adopted.

Next, the effectiveness of the Al mole fraction (band gap) of the p-$Al_{0.10}Ga_{0.85}In_{0.05}N$ intermediate layer (doping enhancement layer) 1708 being smaller than that of the p-$Al_{0.16}Ga_{0.75}In_{0.10}N$ overflow suppression layer 1709 and greater than that of the p-$Al_{0.03}Ga_{0.97}N$ cladding layer 1710, and the effectiveness of an In mole fraction being contained in the p-$Al_{0.16}Ga_{0.75}In_{0.10}N$ overflow suppression layer 1709 and the p-$Al_{0.10}Ga_{0.85}In_{0.05}N$ intermediate layer 1708 will be described.

A feature of the structure employed in the present embodiment is that the p-$Al_{0.10}Ga_{0.85}In_{0.05}N$ intermediate layer (doping enhancement layer) 1708, which is a layer having a relatively high Al mole fraction, is inserted immediately before the AlGaInN electron overflow suppression layer, and Mg doping is begun during the formation of the p-$Al_{0.10}Ga_{0.85}In_{0.05}N$ intermediate layer. As has been described in Embodiment 8, an alloy semiconductor layer which contains Al has a great feature in that a p-type impurity (e.g., Mg) is likely to be taken into it, and thus doping lags are unlikely to occur. Moreover, there is an Al mole fraction dependence in how likely the p-type impurity is to be taken in. With respect to Al mole fractions ranging from 0% to 50%, the amount of p-type impurity that is taken in increases with an increase in the Al mole fraction.

In the present embodiment, AlGaInN (which contains In) is used in order to reduce the lattice constant difference, unlike in Embodiment 8 where AlGaN having a large lattice constant difference from InGaN is simply placed near the active layer. By adopting this structure, the lattice constant difference can be reduced while reducing doping lags with the high Al mole fraction, thus eliminating non-uniformity of strain in the well layers composing the active layer as much as possible, and reducing the influence on the emission characteristics.

Figure 15:
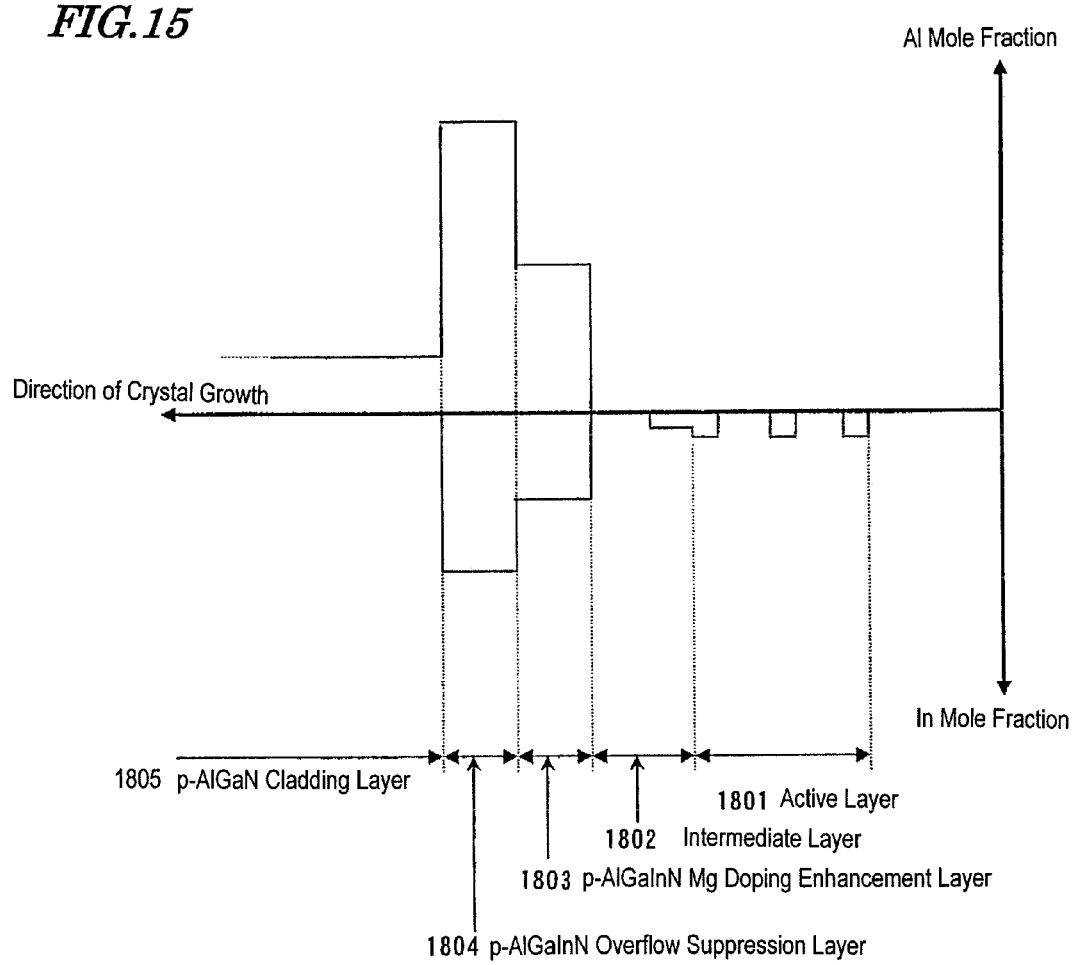
FIG. 15 is a schematic diagram showing a conduction-band structure near an active layer of the semiconductor laser of Embodiment 9.

FIG. 15 is a diagram showing a structure near the active layer according to the present embodiment. From the active layer side, it is composed of three or more regions of layers differing in their film thickness, Al mole fraction (band gap), and In mole fraction. In the present embodiment, the p-AlGaInN doping enhancement layer 1803 corresponds to the first p-type nitride semiconductor layer; the p-AlGaInN overflow suppression layer 1804 corresponds to the second p-type nitride semiconductor layer; and the p-AlGaN cladding layer 1805 corresponds to the third p-type nitride semiconductor layer. The Al mole fraction (band gap) of the first p-type nitride semiconductor layer is chosen so as to be smaller than that of the second p-type nitride semiconductor layer and greater than that of the third p-type nitride semiconductor layer. It is desirable that the Al mole fraction of the first p-type nitride semiconductor layer is as high as possible, so long as its band gap is smaller than that of the second p-type nitride semiconductor layer. In addition to this, since an In mole fraction is contained in the second p-type nitride semiconductor layer and the first p-type nitride semiconductor layer, it is possible to reduce the lattice constant difference from the active layer which is present in their neighborhood. The existence of the first p-type nitride semiconductor layer eliminates doping lags of the p-type impurity, which would have occurred in conventional structures, and guarantees a sufficient impurity concentration for the second p-type nitride semiconductor layer.

Note that the desirable Al mole fraction is 5 to 20% for the first p-type nitride semiconductor layer, 10 to 30% for the second p-type nitride semiconductor layer, and 3 to 9% (on average) for the third p-type nitride semiconductor layer. The most desirable Al mole fraction is 6 to 12% for the first p-type nitride semiconductor layer, 15 to 20% for the second p-type nitride semiconductor layer, and 3.5 to 5.5% (on average) for the third p-type nitride semiconductor layer. The desirable In mole fraction is 1 to 20% for the first p-type nitride semiconductor layer, and 1 to 30% for the second p-type nitride semiconductor layer. Thus, it is desirable to prescribe the In mole fraction to be at least smaller than the Al mole fraction of each layer.

Figure 16:
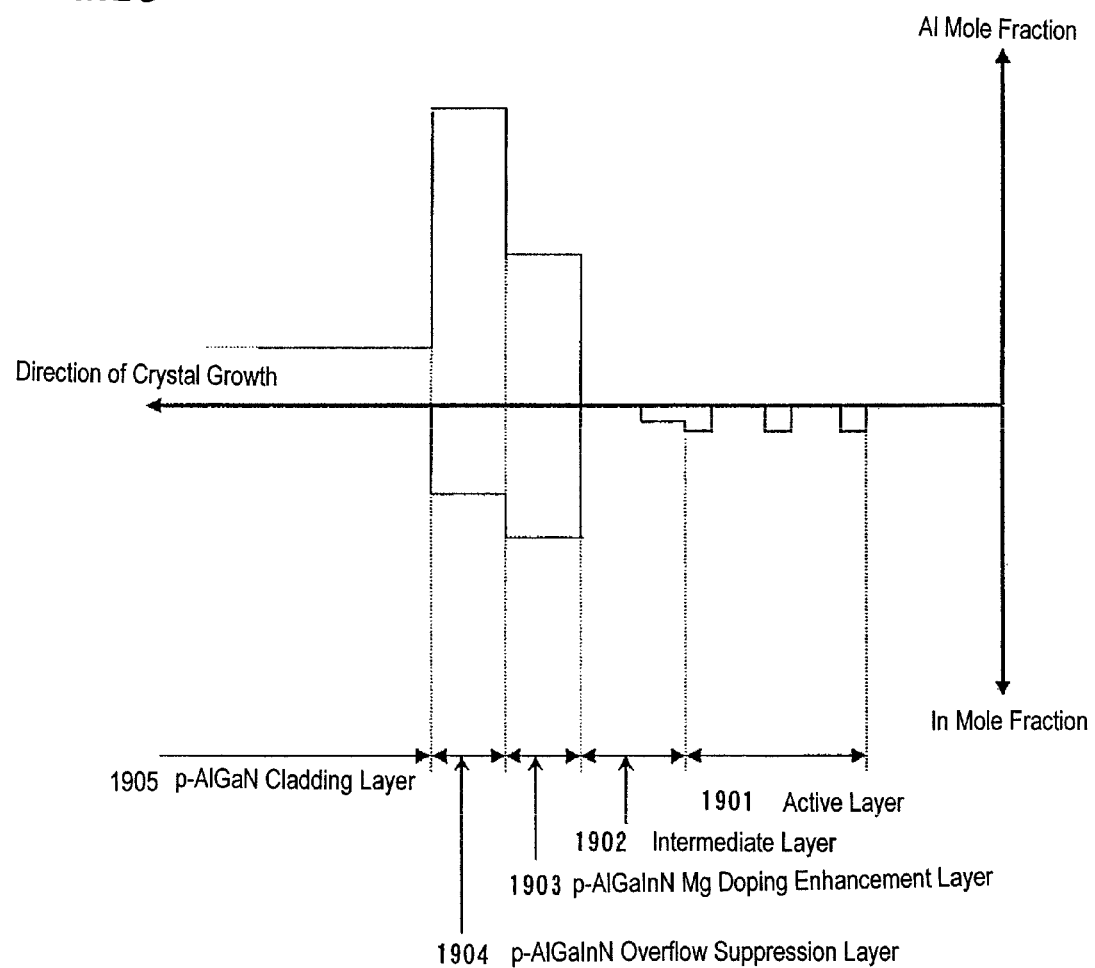
FIG. 16 is a schematic diagram showing another conduction-band structure near an active layer of the semiconductor laser of Embodiment 9.

In the present embodiment, since the Al mole fraction of the second p-type nitride semiconductor layer is prescribed to be higher than the Al mole fraction of the first p-type nitride semiconductor layer, the In mole fraction is also prescribed to be higher in the second p-type nitride semiconductor layer than in the first p-type nitride semiconductor layer. As a result, the differences between the lattice constants of the respective layers can be made small, and the strain in the active layer can be further reduced. However, in the case where the distance from the first p-type nitride semiconductor layer to the active layer is relatively close, the lattice constant of the first p-type nitride semiconductor layer may exert a greater influence on the strain in the active layer than does the second p-type nitride semiconductor layer having a large Al mole fraction. In such a case, it is preferable to prescribe the In mole fraction so as to be smaller in the second p-type nitride semiconductor layer (p-AlGaInN overflow suppression layer 1904) than in the first p-type nitride semiconductor layer (p-AlGaInN doping enhancement layer 1903), as shown in FIG. 16.

Moreover, when the layers having high Al mole fractions (e.g., the first p-type nitride semiconductor layer and the second p-type nitride semiconductor layer) are made thick, an increase in the serial resistance will result; therefore, the film thicknesses of these layers must be made smaller than that of the third p-type nitride semiconductor layer. Accordingly, the desirable film thickness of each layer is 1 to 50 nm for the first p-type nitride semiconductor layer, and 5 to 20 nm for the second p-type nitride semiconductor layer. A more desirable film thickness is 5 to 20 nm for the first p-type nitride semiconductor layer, and 5 to 10 nm for the second p-type nitride semiconductor layer.

Note that the Al mole fraction and the In mole fraction of the first p-type nitride semiconductor layer may have a gradient so long as they fall within the aforementioned desirable ranges of Al mole fraction and In mole fraction. This gradient may be gradual or stepwise. Moreover, each region may be a superlattice layer instead of a bulk layer, so long as it falls within the aforementioned desirable ranges of Al mole fraction, In mole fraction, and film thickness. Bulk layers and superlattice layers may both be present.

With the structure of the present embodiment, a high Mg concentration of $9 \times 10^{18}$ cm$^{-3}$ or more was experimentally confirmed, already in the neighborhood of the interface of the AlGaInN electron overflow suppression layer 1804 with the p-AlGaInN doping enhancement layer. This value is on a comparable level to the Mg concentration illustrated in Embodiment 8, indicative that similar doping effects can be obtained also in the case where the lattice constant difference is reduced with an In mole fraction, so long a high Al mole fraction is used. The doping start position must be at the beginning or in the middle of the doping enhancement layer 1803. Note that it suffices if impurity doping is performed in a whole or a part of the doping enhancement layer, and it is not necessary for the impurity concentration to be uniform within the layer. As for the doping concentration in the overflow suppression layer 1804, it is desirable that uniform doping with a p-type impurity of, at the most, from $8 \times 10^{18}$ cm$^{-3}$ to $2 \times 10^{19}$ cm$^{-3}$ is obtained.

Thus, insertion of the AlGaInN doping enhancement layer 1803 makes it possible to suppress the influence of Mg doping lags, and the Mg concentration in the AlGaInN electron overflow suppression layer 804 having the largest band gap energy in the laser structure was made substantially equal to the Mg concentration in the cladding layer. By improving the hole injection efficiency, the threshold current can be reduced. In particular, by implementing the doping enhancement layer 1803 as a superlattice layer, portions having a high Al concentration can be formed even if the average Al mole fraction may be the same, whereby the steepness of Mg take-in can be improved. Moreover, by implementing the overflow suppression layer 1804 as a superlattice layer, it becomes possible to reduce the activation energy of the Mg acceptor, whereby the serial resistance can be reduced.

Through such structural means, if the overflow suppression layer 1804 can be adequately doped with a p-type dopant, carriers can be sufficiently blocked in this layer. As a result, it is hardly necessary to take carrier confinement in the cladding layers into consideration, and thus it is possible to reduce the Al mole fraction of the AlGaN cladding layer 1805. Note that, as for light confinement, the reduced Al mole fractions of the cladding layers can be made up for by increasing the thickness of the cladding layers. Thus, by controlling the p-type dopant concentration through structural means, the carrier confinement can be improved, and low resistance can be realized by reducing the Al mole fractions of the cladding layers. As a result, the serial resistance of the device can be reduced, and the operating voltage can be lowered.

The present embodiment illustrates a laser structure on a GaN substrate. However, the crystal growth according to the present invention may be any crystal growth that utilizes the principles under the aforementioned conditions, and the substrate is not limited to GaN. It may be a nitride semiconductor bulk substrate such as AlGaN, InGaN or AlGaInN; a sapphire substrate or a silicon carbide substrate; a silicon substrate; GaN which is grown on a gallium arsenide substrate, etc., or may be an ELO-GaN substrate which is fabricated via lateral epitaxial overgrowth.

Although the semiconductor devices in the above-described embodiments are all laser devices, the present invention is not limited thereto, but is also applicable to all nitride semiconductor devices which have a pn junction and which require prevention of electron overflow and low resistance at the same time. For example, the present invention is applicable to a nitride semiconductor device such as a light-emitting diode device, a photosensitive device, or a transistor.

Although Mg is used as the p-type acceptor impurity in all of the above-described embodiments, carbon (C), zinc (Zn), beryllium (Be), or cadmium (Cd) may be added besides Mg. The nitride semiconductor to be doped with Mg may be BAlGaInN, or an AlGaInNAsP alloy compound semiconductor containing As and P.

Industrial Applicability

According to the present invention, a p-type acceptor impurity doping start layer which has a greater band gap energy than that of an active layer and a smaller band gap energy than that of an electron overflow suppression layer is provided, whereby a steep acceptor impurity profile which is free from doping lags due to the memory effect can be realized. As a result, a low threshold current/low operating voltage compound semiconductor light receiving/emitting device having a high reliability can be fabricated with a good reproducibility and uniformity.

As such, a nitride semiconductor device according to the present invention is useful mainly as a light source in fields that are related to optical disks, and can also be applied in laser printers, bar-code readers, and the like.

The invention claimed is:

1. A nitride semiconductor device comprising:
a p-type nitride semiconductor layer,
an n-type nitride semiconductor layer, and
an active layer interposed between the p-type nitride semiconductor layer and the n-type nitride semiconductor layer, wherein
a GaN layer is interposed the active layer and the p-type nitride semiconductor layer;
the p-type nitride semiconductor layer includes:
  a first p-type AlGaN layer containing Mg;
  a second p-type AlGaN layer containing Mg; and
  a cladding layer having a smaller band gap than the second p-type AlGaN layer; the cladding layer containing Mg;
the first p-type AlGaN layer is located between the GaN layer and the second p-type AlGaN layer;
the molar ratio of the aluminum contained in the second p-type AlGaN layer is greater than the molar ratio of the aluminum contained in the first p-type AlGaN layer so that the second p-type AlGaN layer has a greater band gap than the first p-type AlGaN layer;
an upper surface of the GaN layer is in contact with a lower surface of the first p-type AlGaN layer;
an upper surface of the first p-type AlGaN layer is in contact with an lower surface of the second p-type AlGaN layer,
the second p-type AlGaN layer is located between the cladding layer and the first p-type AlGaN layer,
the lower surface of the first p-type AlGaN has a Mg concentration of not more than $1\times10^{17}$ cm$^{-3}$;
the upper surface of the first p-type AlGaN has a Mg concentration of not less than $9.5\times10^{18}$ cm$^{-3}$;
the Mg concentration in the first AlGaN layer is increased in a direction from the lower surface of the first AlGaN layer toward the upper surface of the first AlGaN layer;
the first p-type AlGaN layer has a thickness of not less than 1 nanometer and not more than 50 nanometers;
the second p-type AlGaN layer and the cladding layer has a Mg concentration of not less than $1\times10^{19}$ cm$^{-3}$;
the Mg concentration of the second p-type AlGaN layer is substantially same as the Mg concentration of the cladding layer; and
the Mg concentration in the cladding layer is constant.

2. The nitride semiconductor device of claim 1, wherein the second p-type AlGaN layer functions as a barrier layer for suppressing a carrier overflow from the active layer.

3. The nitride semiconductor device of claim 1, wherein the cladding layer has a smaller band gap than the first p-type AlGaN layer.

4. The nitride semiconductor device of claim 1, wherein the cladding layer includes a multilayer structure where a p-type AlGaN layer and a p-type GaN layer are stacked alternately.

5. The nitride semiconductor device of claim 1, wherein the cladding layer includes a multilayer structure where a p-type first cladding AlGaN layer and a p-type second cladding AlGaN layer are stacked alternately; and
the p-type first cladding AlGaN layer has a higher molar ratio of aluminum than the p-type second cladding AlGaN layer.

6. The nitride semiconductor device of claim 1, wherein the first p-type AlGaN layer further contains indium.

7. The nitride semiconductor device of claim 1, wherein the molar ratio of aluminum included in the first p-type AlGaN layer is increased in a direction from the lower surface of the first p-type AlGaN layer toward the upper surface of the first p-type AlGaN layer.

8. A production method for a nitride semiconductor device comprising a p-type nitride semiconductor layer, an n-type nitride semiconductor layer, and an active layer interposed between the p-type nitride semiconductor layer and the n-type nitride semiconductor layer, wherein
a GaN layer is interposed the active layer and the p-type nitride semiconductor layer;
the p-type nitride semiconductor layer includes:
  a first p-type AlGaN layer containing Mg;
  a second p-type AlGaN layer containing Mg; and
  a cladding layer having a smaller band gap than the second p-type AlGaN layer; the cladding layer containing Mg;
the first p-type AlGaN layer is located between the GaN layer and the second p-type AlGaN layer;
the molar ratio of the aluminum contained in the second p-type AlGaN layer is greater than the molar ratio of the aluminum contained in the first p-type AlGaN layer so that the second p-type AlGaN layer has a greater band gap than the first p-type AlGaN layer;
an upper surface of the GaN layer is in contact with a lower surface of the first p-type AlGaN layer;
an upper surface of the first p-type AlGaN layer is in contact with an lower surface of the second p-type AlGaN layer;
the second p-type AlGaN layer is located between the cladding layer and the first p-type AlGaN layer;
the lower surface of the first p-type AlGaN has a Mg concentration of not more than $1\times10^{17}$ cm$^{-3}$;
the upper surface of the first p-type AlGaN has a Mg concentration of not less than $9.5\times10^{18}$ cm$^{-3}$;
the Mg concentration in the first p-type AlGaN layer is increased in a direction from the lower surface of the first AlGaN layer toward the upper surface of the first p-type AlGaN layer;
the first p-type AlGaN layer has a thickness of not less than 1 nanometer and not more than 50 nanometers;
the second p-type AlGaN layer and the cladding layer has a Mg concentration of not less than $1\times10^{19}$ cm$^{-3}$;
the Mg concentration of the second p-type AlGaN layer is substantially same as the Mg concentration of the cladding layer; and
the Mg concentration in the cladding layer is constant; the production method comprising:
a step of forming the n-type nitride semiconductor layer;
a step of forming the active layer;
a step of forming the GaN layer by supplying a source gas without supplying any p-type impurities;

a step of forming a part of the first p-type AlGaN layer which contains Al by supplying a source gas having Al without supplying any p-type impurities;

a step of forming another part of the first p-type AlGaN layer which contains Al and Mg by supplying both a source gas having Mg and a source gas having Al after the step of forming the part of the first p-type AlGaN layer;

a step of forming the second p-type AlGaN layer on the first p-type AlGaN layer by supplying a source gas having Mg; and a step of forming the cladding layer after the step of forming the second p-type AlGaN layer.

* * * * *